US 9,740,406 B2

(12) United States Patent
Gaertner et al.

(10) Patent No.: US 9,740,406 B2
(45) Date of Patent: *Aug. 22, 2017

(54) DYNAMIC GRANULE-BASED INTERMEDIATE STORAGE

(71) Applicant: Seagate Technology LLC, Cupertino, CA (US)

(72) Inventors: Mark A. Gaertner, Vadnais Heights, MN (US); Brian Thomas Edgar, Minneapolis, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/177,022

(22) Filed: Jun. 8, 2016

(65) Prior Publication Data

US 2016/0283115 A1    Sep. 29, 2016

Related U.S. Application Data

(63) Continuation of application No. 13/973,491, filed on Aug. 22, 2013, now Pat. No. 9,384,793, which is a
(Continued)

(51) Int. Cl.
*G06F 3/06* (2006.01)
*G11C 7/10* (2006.01)

(52) U.S. Cl.
CPC ............. *G06F 3/061* (2013.01); *G06F 3/064* (2013.01); *G06F 3/0613* (2013.01);
(Continued)

(58) Field of Classification Search
CPC ... G11C 7/1012; G11C 7/1072; G06F 3/0613; G06F 3/0665; G06F 3/0676; G06F 3/061; G06F 3/064; G06F 3/0659
See application file for complete search history.

(56) References Cited

U.S. PATENT DOCUMENTS 7,809,252 B2    10/2010 Lai et al.
7,910,854 B2     3/2011 Besson et al.
(Continued)

FOREIGN PATENT DOCUMENTS

CN    101576856 A    11/2009
EP       617358 A1     9/1994
(Continued)

OTHER PUBLICATIONS

European Search Report in European Application EP 14160340.7, mailed Jun. 12, 2014, 6 pages.
(Continued)

*Primary Examiner* — David X Yi
*Assistant Examiner* — Zubair Ahmed
(74) *Attorney, Agent, or Firm* — Holzer Patel Drennan

(57) ABSTRACT

A data storage system includes data storage and random access memory. A sorting module is communicatively coupled to the random access memory and sorts data blocks of write data received in the random access memory of the data storage. A storage controller is communicatively coupled to the random access memory and the data storage and being configured to write the sorted data blocks into one or more individually-sorted granules in a granule storage area of the data storage, wherein each granule is dynamically constrained to a subset of logical block addresses. A method and processor-implemented process provide for sorting data blocks of write data received in random access memory of data storage. The method and processor-implemented process write the sorted data blocks into one or more individually-sorted granules in a granule storage area of the data storage, wherein each granule is dynamically constrained to a subset of logical block addresses.

17 Claims, 16 Drawing Sheets

Related U.S. Application Data continuation of application No. 13/839,595, filed on Mar. 15, 2013.

(52) U.S. Cl.
CPC .......... G06F 3/0659 (2013.01); G06F 3/0665 (2013.01); G06F 3/0676 (2013.01); G11C 7/1012 (2013.01); G11C 7/1072 (2013.01)

(56) References Cited

U.S. PATENT DOCUMENTS

| | | | |
|---|---|---|---|
| 7,996,645 B2* | 8/2011 | New | G06F 3/0608 711/201 |
| 8,370,598 B2 | 2/2013 | Yamada et al. | |
| 8,868,842 B2 | 10/2014 | Yano et al. | |
| 2004/0103241 A1 | 5/2004 | Chang et al. | |
| 2005/0015567 A1 | 1/2005 | Zhoar et al. | |
| 2007/0174582 A1 | 7/2007 | Feldman | |
| 2008/0016275 A1 | 1/2008 | Sebastian et al. | |
| 2008/0155183 A1 | 6/2008 | Zhuang et al. | |
| 2008/0183964 A1 | 7/2008 | Inoue et al. | |
| 2009/0037663 A1 | 2/2009 | Hondou | |
| 2009/0157940 A1* | 6/2009 | Sanvido | G06F 3/0611 711/5 |
| 2010/0146207 A1 | 6/2010 | Kakui et al. | |
| 2010/0174846 A1 | 7/2010 | Paley et al. | |
| 2010/0180083 A1 | 7/2010 | Lee et al. | |
| 2010/0299495 A1 | 11/2010 | Frank | |
| 2011/0004724 A1 | 1/2011 | Jo et al. | |
| 2011/0106804 A1 | 5/2011 | Keeler et al. | |
| 2011/0119442 A1 | 5/2011 | Haines et al. | |
| 2011/0161557 A1 | 6/2011 | Haines et al. | |
| 2011/0197035 A1 | 8/2011 | Na et al. | |
| 2011/0208924 A1 | 8/2011 | Kakui et al. | |
| 2012/0079229 A1 | 3/2012 | Jensen et al. | |
| 2012/0102276 A1 | 4/2012 | Haines et al. | |
| 2012/0131265 A1 | 5/2012 | Koltsidas et al. | |
| 2012/0151134 A1 | 6/2012 | Freindshuh et al. | |
| 2012/0198149 A1 | 8/2012 | Panabaker et al. | |
| 2012/0278679 A1 | 11/2012 | Rub et al. | |
| 2012/0300326 A1* | 11/2012 | Hall | G11B 5/012 360/15 |
| 2013/0031317 A1 | 1/2013 | Ryu et al. | |
| 2013/0038960 A1 | 2/2013 | Song | |
| 2013/0135767 A1* | 5/2013 | Hall | G06F 3/061 360/66 |
| 2013/0232292 A1* | 9/2013 | Bandic | G06F 3/061 711/103 |

FOREIGN PATENT DOCUMENTS

| | | |
|---|---|---|
| JP | H09293008 A | 11/1997 |
| JP | 2000-222287 A | 8/2000 |
| JP | 2004-334419 A | 11/2004 |
| JP | 2008-140459 A | 6/2008 |
| JP | 2009-160813 A | 7/2009 |
| JP | 2010-257094 A | 11/2010 |
| JP | 2012-113662 A | 6/2012 |
| WO | 2007-149195 A1 | 12/2007 |
| WO | 2011-115219 A1 | 9/2011 |

OTHER PUBLICATIONS

European Search Report issued in European Application No. 14160349.8, mailed Aug. 4, 2014, 7 pages.

* cited by examiner

DYNAMIC GRANULE-BASED INTERMEDIATE STORAGE

CROSS-REFERENCE TO RELATED APPLICATIONS

This application is a continuation of U.S. application Ser. No. 13/973,491, entitled "Dynamic Granule-Based Intermediate Storage" and filed on Aug. 22, 2013, which is a continuation of U.S. application Ser. No. 13/839,595, entitled "Dynamic Granule-Based Intermediate Storage" and filed on Mar. 15, 2013. Both of these references are specifically incorporated by reference for all that they disclose or teach.

This application relates to U.S. application Ser. No. 13/839,132, entitled "Staging Sorted Data in Intermediate Storage" and filed on Mar. 15, 2013, which is specifically incorporated by reference for all that it discloses and teaches.

BACKGROUND

Some data storage systems, such as those containing rotating magnetic storage, magnetic tape, and/or rotating optical storage, suffer from relatively high latency times (e.g., in the milliseconds range or more) to reach a randomly-targeted location within physical storage. Once the targeted location is reached (e.g., via a seek operation), data can be transferred (read or written) relatively sequentially from the physical storage at a reasonably high rate. One of many challenges relating to improving data transfer rates is managing the transfer requests of a host within the constraints of physical location and logical ordering of the requested data within the data storage system.

SUMMARY

Embodiments described and claimed herein address the foregoing problems by efficiently segregating dynamically mapped data throughout multiple levels of physical storage within a data storage system. Such efficient data segregation can reduce deviation in the behavior of logically sequential data accesses to the physical storage media, especially in the presence of shingled magnetic recording regions.

A data storage system includes data storage and a random access memory. A sorting module is communicatively coupled to the random access memory and sorts data blocks of write data received in the random access memory of the data storage. A storage controller is communicatively coupled to the random access memory and the data storage and being configured to write the sorted data blocks into one or more individually-sorted granules in a granule storage area of the data storage, wherein each granule is dynamically constrained to a subset of logical block addresses.

A method and processor-implemented process provide for sorting data blocks of write data received in a random access memory of data storage. The method and processor-implemented process write the sorted data blocks into one or more individually-sorted granules in a granule storage area of the data storage, wherein each granule is dynamically constrained to a subset of logical block addresses.

Other embodiments are also described and recited herein.

BRIEF DESCRIPTIONS OF THE DRAWINGS

DETAILED DESCRIPTIONS

Figure 1:
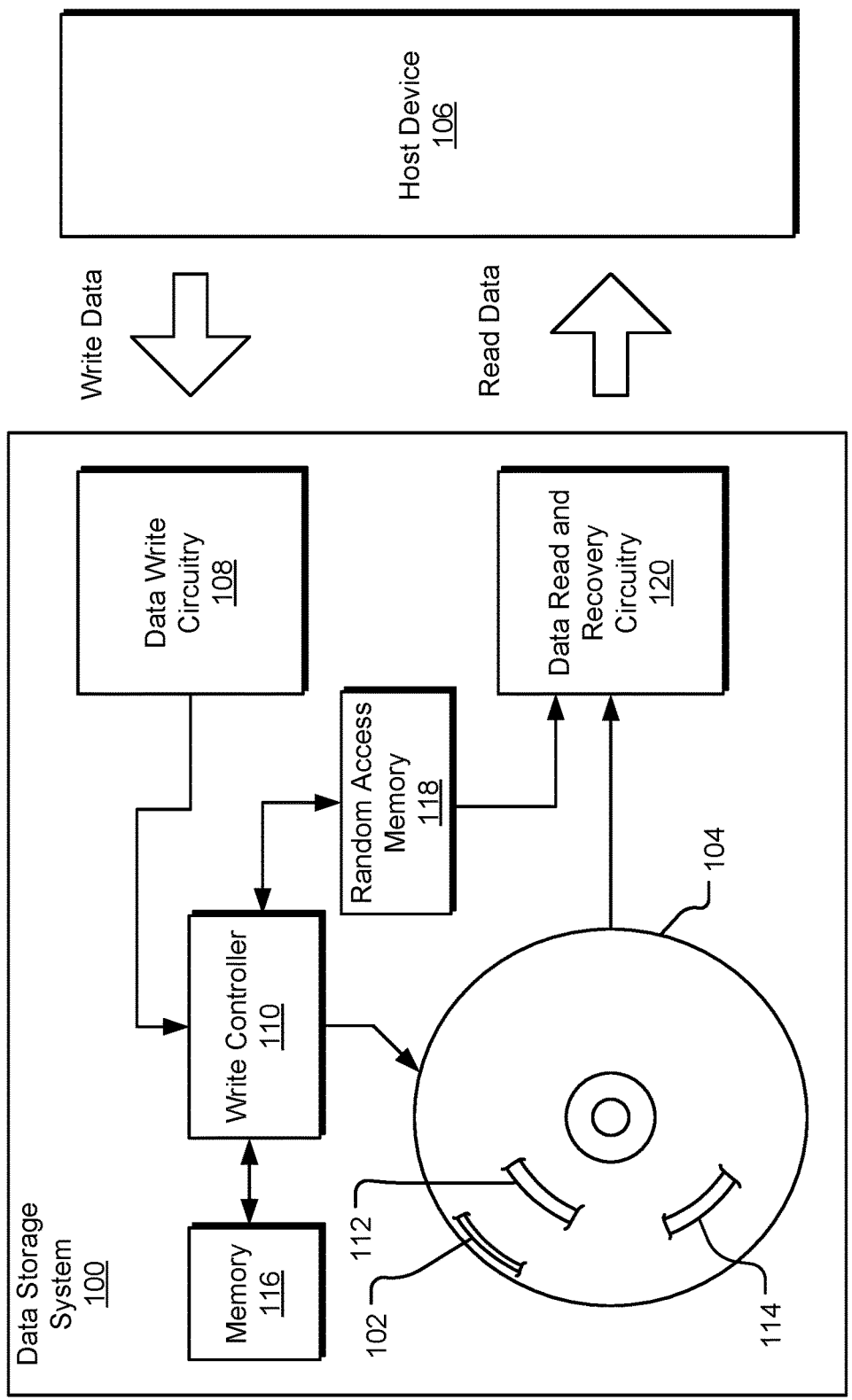
FIG. 1 illustrates an example data storage system for staging sorted data in a staging area of intermediate latency storage.

FIG. 1 illustrates an example data storage system 100 for staging sorted data in a staging area 102 of intermediate latency storage. In the illustrated example, the data storage system 100 represents a hard disc drive having one or more magnetic storage discs 104, although other embodiments of such a storage medium may be in the form of an optical disc reader (e.g., a CD reader/writer or a DVD reader/writer), a tape drive, a solid state drive (SSD), etc. The data storage system 100 communicates with a host device 106, which sends write data to and receives read data from the data storage system 100.

For example, the host device 106 can write a data file to the data storage system 100, which records the data file on the magnetic storage disc 104 and can later read the data file from the data storage system 100. At the host level, user data is often structured in terms of variable length files, which can be constituted from one or more fixed length data blocks. The data blocks are addressable by the host device 106 using logical block addresses (LBAs). The data storage system 100 includes a write channel having data write circuitry 108, which encodes the data blocks according to an encoding scheme used by the data storage system 100. One or more data blocks may be combined with redundancy information to form self-contained codewords for error detection and/or correction.

The data write circuitry 108 writes the data blocks through a write controller 110, which determines the physical location and ordering of the data blocks written by the write controller 110 to one or more levels of data storage within the data storage system 100. When a data block is written to the storage disc 104, the data block is written to a physical block address (PBA) on the storage disc 104. The mapping between LBA and PBA can change over time and is referred to as "dynamic mapping." The write controller 110 manages the dynamic mapping between LBA and PBA, even as the mapping changes over time. Memory 116 may store firmware instructions that are processed by the write controller 110 to implement dynamic mapping, sorting, relocation, overprovisioning, and other functions performed by the write controller 110.

In the data storage system 100, groups of data blocks having consecutive logical addresses can be recorded in approximately consecutive physical locations on the storage disc 104 to achieve a lower latency for successive data accesses after the seek operation for certain sets of data. In addition, dynamic mapping can be intelligently extended to support multiple levels of physical storage within the data storage system 100, wherein different levels of physical storage can provide different average access latencies.

As referenced above, the write controller 110 can write data blocks to one or more levels of data storage within the data storage system 100. For example, a data storage area 112 of the storage disc 104, referred to as "destination storage," represents a physical storage area generally intended for long term storage. Although data in destination storage is intended for long term storage, such data may still be moved from destination storage locations to other destination storage locations over time. In addition, a data storage area 114 of the storage disc 104, referred to as "granule storage," represents intermediate physical storage in which data stored in each dynamically-sizeable granule is constrained to a certain subset of logical block addresses (LBAs). An example granule size may be about 1 MB, although other sizes may be employed. In fact, granules may be of many different sizes on the same disc surface or even within the same shingled media recording band.

Furthermore, a data storage area 102 of the storage disc 104, referred to as "a staging area," represents a physical storage area in which groups of logical blocks can be incrementally written and rewritten in an increasingly contiguous LBA order. For example, data blocks can be initially received by the data storage system 100 from the host device 106 in an arbitrary or sparse LBA order (e.g., the data blocks are received from diverse areas in logical space). Such data blocks may be written to the staging area in a physically contiguous manner.

Random access memory 118 also represents a storage area of the data storage system 100. Its random access characteristics and low access latency provide a storage area appropriate for sorting data blocks according to certain constraints (e.g., LBA ordering, PBA ordering, most-frequently-accessed order, prioritized data order, etc.). In one embodiment, data is received into the random access memory 118, sorted according to an LBA order, and written to the staging area in groups of data called "chunks," which are sized in association with the available amount of the random access memory 118. An example chunk size may be 64 MB, although other sizes may be employed.

Data read and recovery circuitry 120 can read the data (with appropriate error correction coding) from the magnetic storage disc 104 (or from the random access memory 118) and use the error correction coding to detect and/or correct errors (such as data errors caused by scratch damage on the magnetic storage disc 104). The data read and recovery circuitry 120 then transfers the read data (which may be corrected read data) to the host device 106.

The sorting of data blocks received in the random access memory 118 may be accomplished in a variety of ways. In one embodiment, the sorting may be accomplished by a processor or other control circuitry while the data blocks reside in the random access memory 118. In an alternative embodiment, the sorting may be accomplished during transfer of the data blocks to and/or from the random access memory 118, such as by using a scatter-gather DMA (direct memory access) transfer scheme. Other sorting techniques and configurations may be employed.

In a data storage system, such as data storage system 100 of FIG. 1, a staging area may be a non-shingled or shingled magnetic recording region. In non-shingled magnetic media, each of the cells on a magnetized medium are of a sufficiently large size relative to the size of the write pole to allow the write pole to write data to the cells without overwriting data in any surrounding cells. As a result, data may be randomly written to available cells anywhere on the magnetic medium. However, as requirements for data storage density increase for magnetic media, cell size decreases. A commensurate decrease in the size of the write pole is difficult because a strong write field gradient provided by a larger write pole is often required to shift the polarity of the cells on the magnetized medium. As a result, writing data to smaller cells on the magnetized medium using the relatively larger write pole may affect the polarization of adjacent cells (i.e., overwriting the adjacent cells). One technique for adapting the magnetic medium to utilize smaller cells while preventing adjacent data being overwritten during a write operation is shingled magnetic recording (SMR).

SMR utilizes a large strong write field generated by the write pole. One constraint of shingled magnetic recording is that when data is written to the magnetic media, it is written in sequentially increasing or decreasing radius tracks. The strong write field affects two or more adjacent tracks including the track being written to and one or more previously-written tracks. As a result, in order to change any data cell within the shingled data, all of the shingled data is re-written in the selected sequential write order.

In order to achieve the increased cell density made possible by SMR while compensating for a lack of random write functionality in such a system, one or more isolation regions may be created within with shingled data. The isolation regions, also referred to as guard tracks, are groupings of one or more adjacent data tracks within the shingled data that are unavailable for recording. In operation, the isolation regions define separate data bands (i.e., groups of logical sectors bounded by guard tracks) of shingled data. Typically, each guard track is wide enough to prevent any overwriting across the guard track. As a result, the guard tracks create bands of shingled data, including one or more adjacent tracks, that are isolated from other bands. Consequently, a single band of shingled data is rewritten (rather than all of the shingled data on the disk) when one or more cells within the band are changed.

However, re-writing one or more cells of data in a data band still typically entails multiple steps, including: reading the entire data band, writing data of the data band into a media scratch pad (e.g., a temporary cache) on a disc, reading the data from the media scratch pad, and re-writing the data to the original data band with the one or more changed cells. Consequently, shingled data write operations are typically more time consuming and less power efficient than un-shingled data write operations.

Redundancy information can be interlaced with the written data to create multi-logical-block-sized codewords. The redundancy information could be included each time data is written to the staging area, or the redundancy information could be recorded at predictable intervals, such that incremental redundancy could be maintained if the staging area is appended a few times before receiving enough appended data to reach the predictable location where redundancy information is to reside. Furthermore, the writing of data to the staging area of FIG. 1 (or other staging area) can be paced to perform those processes that free staging area space before those processes that consume staging area space. In this manner, staging area space is more likely to be available for new write data blocks.

Figure 2:
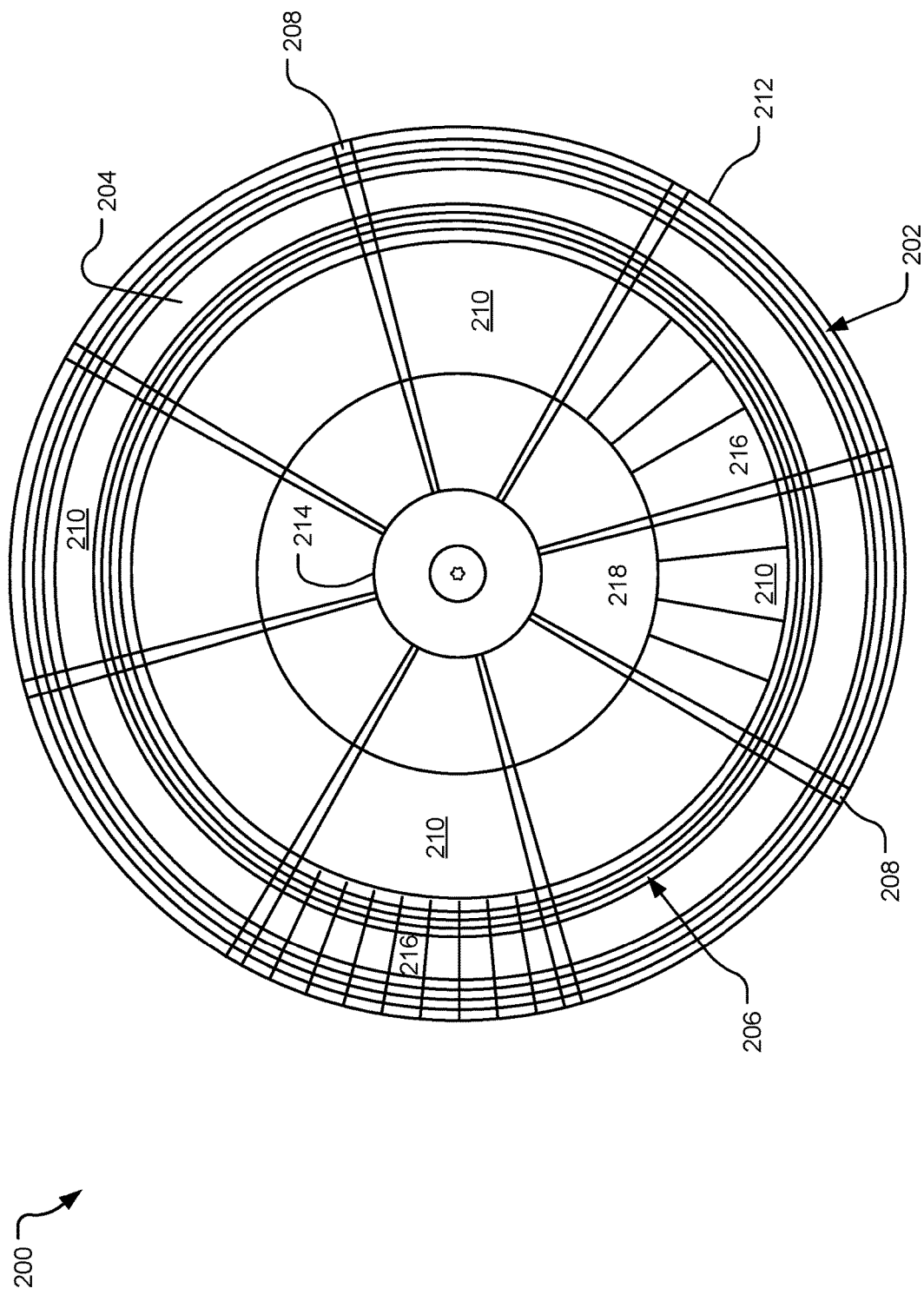
FIG. 2 illustrates an example storage medium with one or more staging areas for chunks of sorted data.

FIG. 2 illustrates an example storage medium 200 with one or more staging areas (such as staging area 202) for chunks of sorted data. In one embodiment, a surface of a data storage disc 204 includes a number of concentric tracks 206. The tracks 206 are distributed on the surface of the storage 204 and may take any number of different forms including without limitation conventional pre-shingled continuous recording, discrete track recording, and shingled magnetic recording. In some embodiments, a single storage disc surface may support both conventional pre-shingled continuous recording and shingled magnetic recording, for example. Further, the same area of a single disc surface may be used for both conventional pre-shingled continuous recording and shingled magnetic recording at different times. In other embodiments, different storage disc surfaces may be dedicated to different recording types (e.g., a surface of one storage disc may used for one type of recording and a surface of the same storage disc or another storage disc may be used for a different type of recording).

Different types of recording can contribute to different levels of access latency. A conventional continuous recording pattern is formed by the write head writing data along tracks designated by servo information stored in radial servo burst sectors (such as servo burst sectors 208). The write head re-writes portions of the track as it writes data to the storage medium, potentially resulting in slight variations in the bounds of individual tracks over time. In contrast, discrete track recording patterns include concentric discrete tracks with non-magnetic inter-track isolation, wherein data is recorded continuously along each isolated track. As such, the write head writes data in consistent sets of discrete target tracks during a write operation. Read and write access to these types of recording areas may differ between them, and further, the segregation and ordering of the data blocks along the tracks can also influence the access latency.

Shingled magnetic recording employs write poles that record wider tracks than that which is required by the read sensors. However, in shingled magnetic recording, a writing operation typically results in the overwriting of adjacent tracks in a given direction. Accordingly, the write tracks are written to overlap each other in the given direction, leaving narrow tracks of data that can be read correctly by the read heads. As such, the overlapping tracks are written in groups or bands of tracks, which are isolated or otherwise separate from other tracks.

When configured with radial servo burst sectors 208, each track 206 is divided into slices called data wedges or sectors 210 between the servo burst sectors 208. Servo burst sectors include data for maintaining accurate positioning of a read/write head over a target track and are positioned at predetermined spaced locations around the storage disc 204.

As the storage disc 204 rotates, the read/write head reads the servo information containing an address within the servo bursts sectors 208 and sends the servo information back to a servo control system. The servo control system checks whether the address in the servo information read from the servo burst sector 208 corresponds to the target track location. If the address does not correspond to the target track location, the servo control system adjusts the position of the read/write head to the correct track location as part of a seek operation.

As indicated above, each track 206 includes discrete data sectors 210 containing stored user information. The number of data sectors 210 contained on a particular track depends, in part, on the length (e.g., circumference) of the track. Besides containing user information, each data sector may also include other data to help identify and process the user information (e.g., error detection and correction coding).

In accordance with an embodiment, one or more portions of the storage disc 204 are reserved for use as a staging area 202, a type of intermediate storage. The staging area 202 is shown in FIG. 2 as being a circumferential grouping of tracks 206 located proximate to the outer diameter of 212 of the storage disc 204. The staging area 202 is shown in FIG. 2 as an example, and it should be understood that the staging area 202 may be written on any other area (radial or circumferential) of the storage disc 204. One characteristic of tracks proximate to the outer diameter 212 is that they can be read with a higher sequential data rate than tracks proximate to the inner diameter 214 of the storage disc 204.

In addition to the one or more staging areas 202, the storage disc 204 also includes one or more granule storage areas 216, a type of intermediate storage, wherein each dynamically-sizeable granule is constrained to a certain subset of logical block addresses (LBAs). The storage disc 204 also includes destination storage areas 218, where data blocks are typically recorded for longer term storage than the other areas of the storage disc 204. In one embodiment, the destination storage areas 218 are characterized by a non-dynamic LBA-to-PBA mapping, at least for certain confined address ranges, although other embodiments may include destination storage areas with some use of dynamic mapping. It should be understood that the illustrated placement of various intermediate and destination storage areas are merely examples, and that such areas may be located at any location on the storage disc 204. Furthermore, one or more of the staging areas 202, the granule storage areas 216, and the destinations storage areas 218 may be shingled magnetic recording regions, non-shingled magnetic recording regions, or regions of other recording formats.

First, as a general comment, it should be understood that write data may take a variety of paths to the various storage areas (e.g., to random access memory, to a staging area, to a granule storage area, to a destination storage area, etc.). In one embodiment, a host device writes data blocks to a random access memory, where the data blocks may or may not be initially sorted. If the random access memory is non-volatile, the data blocks may accumulate in the random access memory to service host device read requests, without being written to other non-volatile storage media. Alternatively, data blocks may be written from the random access memory to a staging area (in individual sorted sets or as unsorted data blocks) or to other storage. Even when the data blocks are written to the staging area or other storage, the same data blocks may also be retained in the random access memory, which can avoid a possible media read operation in the future. Furthermore, it is typically desirable to maintain at least copy of write data in a nonvolatile storage (e.g., NVRAM or another non-volatile storage medium) because of the possibility of power loss.

Figure 3:
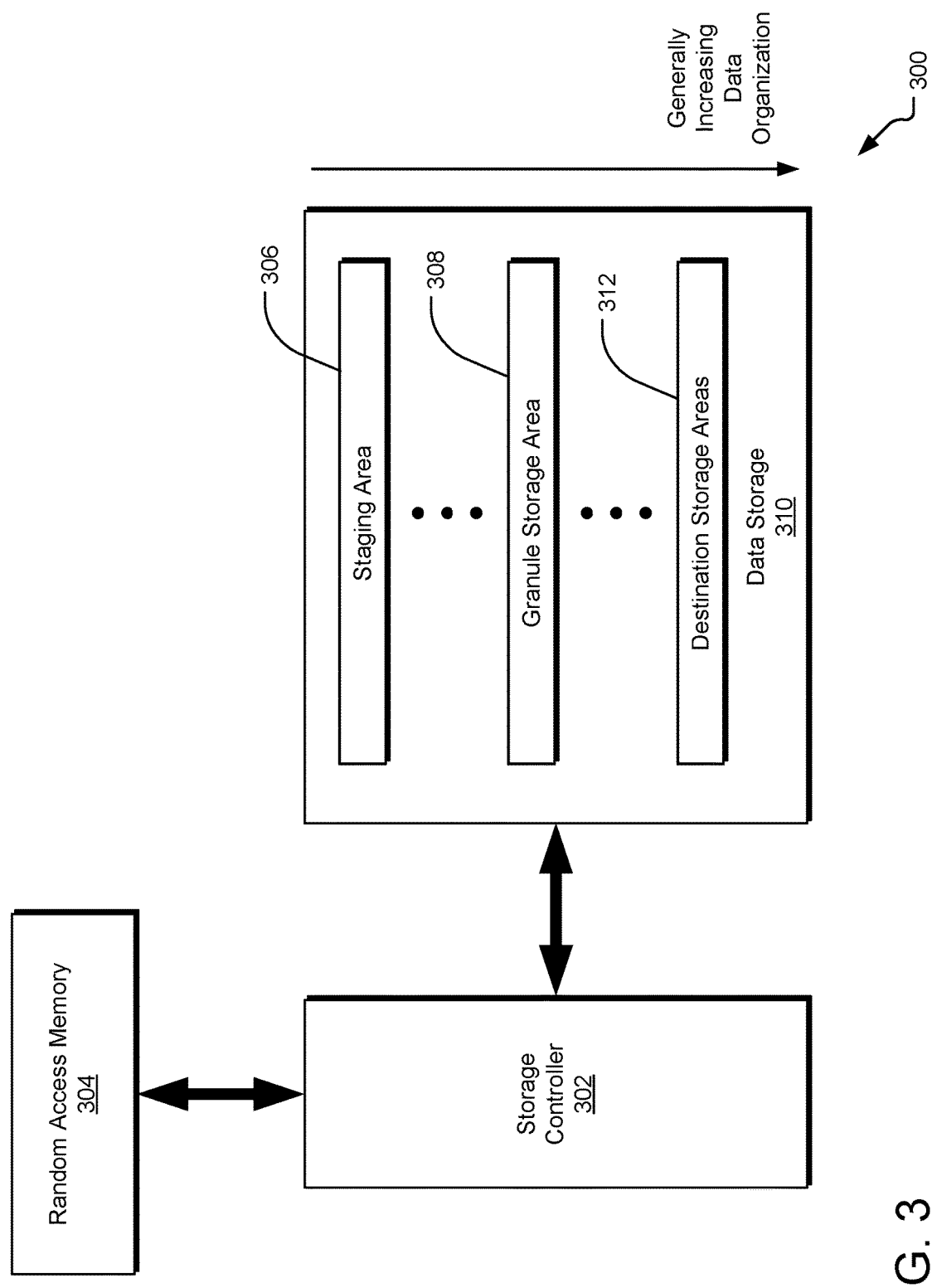
FIG. 3 illustrates an example data storage system with hierarchical storage based on varying levels of generally increasing data organization.

FIG. 3 illustrates an example data storage system 300 with hierarchical storage based on varying levels of generally increasing data organization. A storage controller 302 manages reading and writing of data blocks to various storage areas, whether to random access memory 304, to intermediate storage (e.g., a staging area 306 or a granule storage area 308) of data storage 310, or to destination storage (e.g., a destination storage area 312) of data storage 310. It should be understood that there may be multiple staging areas, multiple granule storage areas, and multiple destination storage areas on a single storage disc. Furthermore, the storage controller 302 may dynamically adjust the role of a given storage area over time. For example, a staging area may be used as a destination storage area at various times of operation.

In one embodiment, the storage controller 302 receives data blocks of new write data, responsive to one or more write commands from a host device. The received data blocks may be received in arbitrary LBA-order—some write commands may be more LBA-ordered while other write commands may be less LBA-ordered, and some combinations of write commands may be targeted at substantially diverse areas of the logical address space. Nevertheless, in this embodiment, the storage controller 302 receives the data blocks into random access memory 304, sorts the data blocks, and writes the sorted data blocks to the staging area 306 in a relatively contiguous physical space in the staging area 306. The term "relatively contiguous" refers to a read/write operation, potentially associated with multiple read/write commands, from/to a physical storage area in which a single seek operation (or few seek operations) are used to complete the read/write operation and data blocks are read from/written to sequential PBAs on one or more tracks. It should be understood that the skipping of damaged, stale, or otherwise "bad" PBAs in the data storage 310 or the reading/writing of data across nearby multiple tracks of the data storage 310 does not preclude a read/write operation from being considered "relatively contiguous."

At any time, but typically during periods of low storage activity, the storage controller 302 can read data stored in the staging area 306 using a relatively contiguous read operation. The read data is transferred to the random access memory 304, sorted in random access memory 304 in a predefined order (e.g., in LBA order, in most-frequently-accessed order, etc.), and then written to the staging area 306 or to another storage area or the host device. In one embodiment, the amount of data read, sorted, and written to the staging area 306 is referred to as a "chunk" and is the same as the size of the random access memory 304, although other sizes may be used (e.g., different portions of the random access memory 304 may be used for different purposes or for different "chunks"). In another embodiment, the read and sorted data may alternatively be transferred to a host device in response to a read command or transferred to another storage area (e.g., flash memory, a granule storage area 308 or a destination storage area 312).

When the storage controller 302 writes the sorted data to the staging area 306, the storage controller 302 typically writes the sorted data to a new location in the staging area 306, rather than overwriting the physical storage of the previously read data with the newly sorted copy of the data. Once the newly sorted data is written to the staging area 306 (or to another storage area), the physical storage containing the previously read data may be marked as stale and reclaimed for use with new write data. The reclamation operation may be referred to as "garbage collection" and may allow for multiple sorted and unsorted versions of the same data to reside in the staging area 306 or other storage areas of the data storage 310 at the same time. In an alternative embodiment, the previous read PBAs may be overwritten with the newly sorted copy of the data. It should also be understood that the reading, sorting, and writing of data recorded in the staging area 306 (or other storage areas) may be repeated multiple times (e.g., to increase the correlation between logical and physical ordering for a particular chunk of data).

It should also be understood that the processing of write operations by the storage controller 302 may be performed in an order that favors creating more room within the staging area to receive new write data. For example, host commands or data storage system operations that generate more stale PBAs in the staging area or that generate more regions of relatively contiguous stale PBAs in the staging area may be performed before host commands or data storage system operations that consume PBAs in the staging area. For example, host commands to delete data blocks may be prioritized ahead of new data write commands. Likewise, data storage system operations that transfer data blocks from a staging area to a granule storage area or a destination storage area may be prioritized ahead of new data write commands. In this manner, the data storage system can prevent or reduce the likelihood that a staging area is too full to accept new write data.

Figure 4:
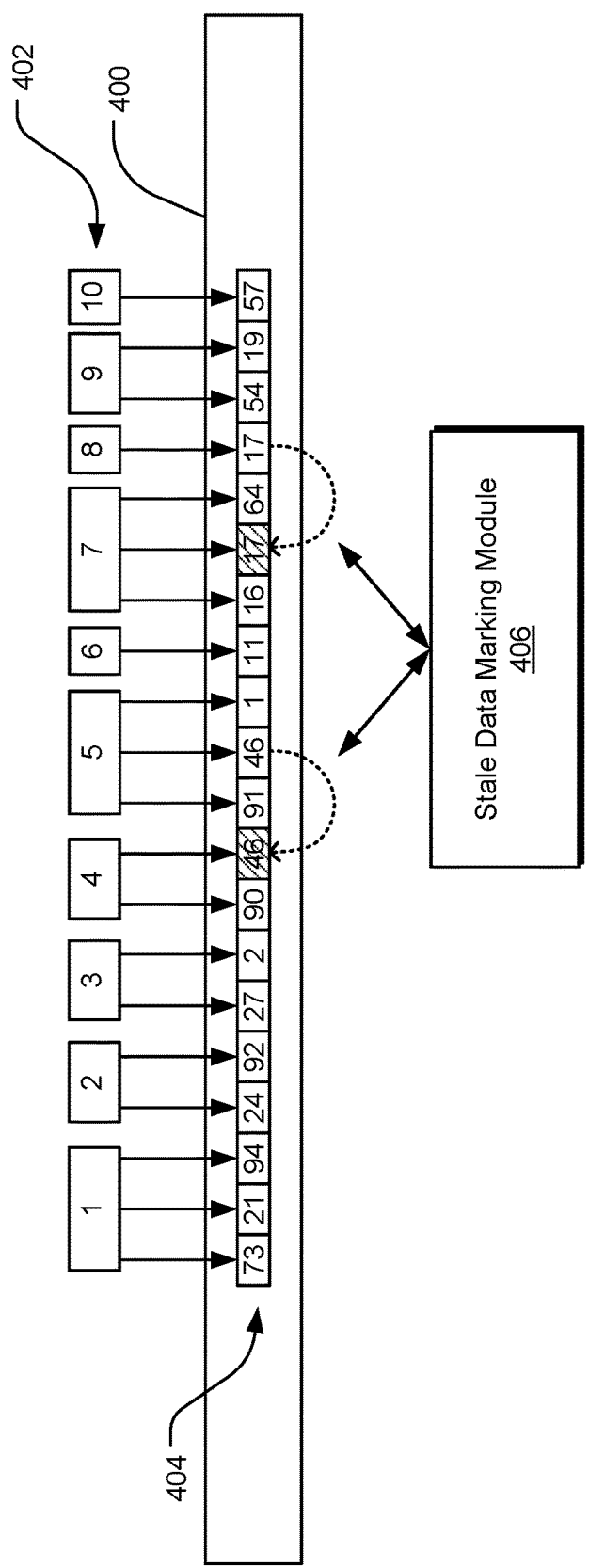
FIG. 4 illustrates an example staging area in which stale data is identified and marked as stale.

FIG. 4 illustrates an example staging area 400 in which stale data is identified and marked as stale. In one embodiment, stale data is "marked" as stale because there is no longer an LBA that translates to the corresponding PBA storing the stale data. FIG. 4 depicts a stale data marking module 406 for illustrative purposes. However, the stale data marking module 406 is typically a functional component of the dynamic mapping subsystem that re-maps the LBA to the PBA containing the fresh data and deletes the mapping of the same LBA to the stale PBA. Another aspect of the stale data marking module 406 may include a counter that records the number of stale locations in a physical subdivision.

The staging area 400 receives data blocks from a storage controller, which records the blocks in a relatively contiguous manner. In FIG. 4, the data is shown as written to the staging area 400 in ten successive write operations 402, from write operation 1 to write operation 10. The write operations 402 designate separate media accesses resulting in the recording of individual data blocks 404 (each marked in FIG. 4 with a corresponding LBA). For example, the write operation 1 writes data blocks associated with LBAs 73, 21, and 94 to the staging area 400 in a relatively contiguous (e.g., physically sequential) manner, and the write operation 2 writes data blocks associated with LBAs 24 and 92 to the staging area 400 in a relatively contiguous (e.g., physically sequential) manner. Responsive to each write operation, the storage controller records an LBA-to-PBA mapping for each data block. In this manner, the storage controller can retrieve a data block requested by the host device from its PBA according to its corresponding LBA. The associated dynamic mapping information may be stored in a storage controller-accessible dynamic mapping table (not shown).

As shown with regard to write operations 4 and 5, a data block associated with LBA 46 is written twice, once in write operation 4 and again in write operation 5. Accordingly, the data block storing the data written in the write operation 4 is now stale, as a more up-to-date data block has been written by the write operation 5. Further, the storage controller updates the dynamic mapping between LBA 46 and the new PBA associated with the write operation 5.

A stale data marking module 406 detects the new write of LBA 46 and therefore marks the data block from the write operation 4 as stale (e.g., LBA 46 no longer maps to the PBA storing the stale data block). Write operations 7 and 8 are also shown as writing the same LBA 17. Accordingly, the stale data marking module 406 marks the data block for LBA 17 written by write operation 7 as stale and updates the dynamic mapping between LBA 17 and the new PBA associated with the write operation 8.

As the storage controller reads the relatively contiguous data from the staging area 400, stale data blocks are ignored or otherwise managed to preclude their transfer to random access memory for sorting and subsequent re-writing to the host device or the storage media. As physical data blocks are marked as stale, the physical data blocks can be reclaimed and reused for new data blocks, including for newly sorted chunks.

It should be understood that all of the write data or one or more portions of the write data shown in the staging area 400 may also be retained in a random access memory (not shown in FIG. 4). As such, copies of the most recently written data from the host device may be maintained in the random access memory as well as the staging area. In this manner, it is unnecessary for the storage controller to read from the staging area in order to gain access to the most recently written data in the random access memory.

Figure 5:
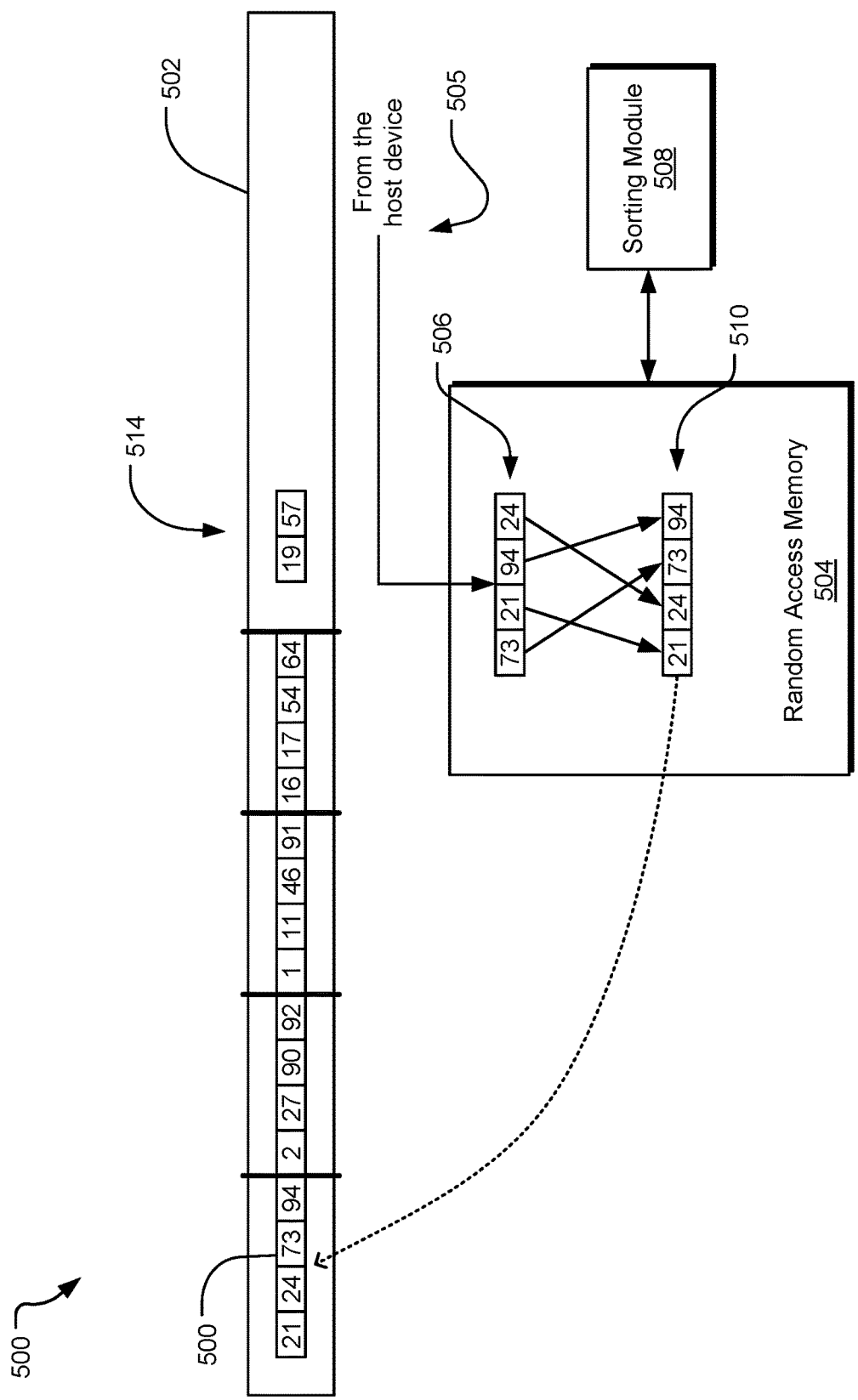
FIG. 5 illustrates an example generation of a chunk of sorted data in a staging area.

FIG. 5 illustrates an example generation of a chunk 500 of sorted data in a staging area 502. In one embodiment, when the host device writes data blocks to the storage controller, the storage controller writes the data blocks directly to the random access memory 504, as shown at 505, where it can be sorted and copied to the staging area 502 while still maintaining a sorted copy in the random access memory. In an alternative embodiment, the storage controller can read an unsorted sequence of data blocks from the staging area 502 into random access memory 504, shown as data blocks at 506.

A sorting module 508 sorts the data according to LBA order, shown as data blocks at 510, although it should be understood that the sorting module 508 may sort the data blocks according to other ordering preferences, including most-frequently-accessed, most-recently-accessed, etc. Various sorting methods may be used to sort the data blocks within the random access memory 504. The sorted data ("the chunk") is then written in a relatively contiguous manner to another location within the staging area 502, to the host device, or to other intermediate or destination storage areas of the storage media. As previously discussed, in an alternative embodiment, the sorted chunk may be re-written over the previously read data, although FIG. 5 shows the chunk 500 as written to a separate location in the same staging area 502.

Responsive to the writing of the new chunk 500 to the staging area 502, the storage controller updates the dynamic mapping information to reflect the new relationships between the LBAs (21, 24, 73, and 94) and their new PBAs within the staging area 502. In addition, a stale data marking module marks the previous PBAs that stored the previous data blocks for the same LBAs as stale. In this manner, those PBAs may be reclaimed to be reused for new write data. Typically, each time a set of data blocks is sorted and "chunked," the average access latency of those data blocks is reduced because, in the case of LBA ordering, the subsequent read operations are accessing data with a better LBA-to-PBA mapping. In one perspective, the transfer of multiple, sorted data blocks per media access to/from the staging area amortizes the latencies between relatively contiguous physical media accesses across a larger number of data blocks.

Figure 6:
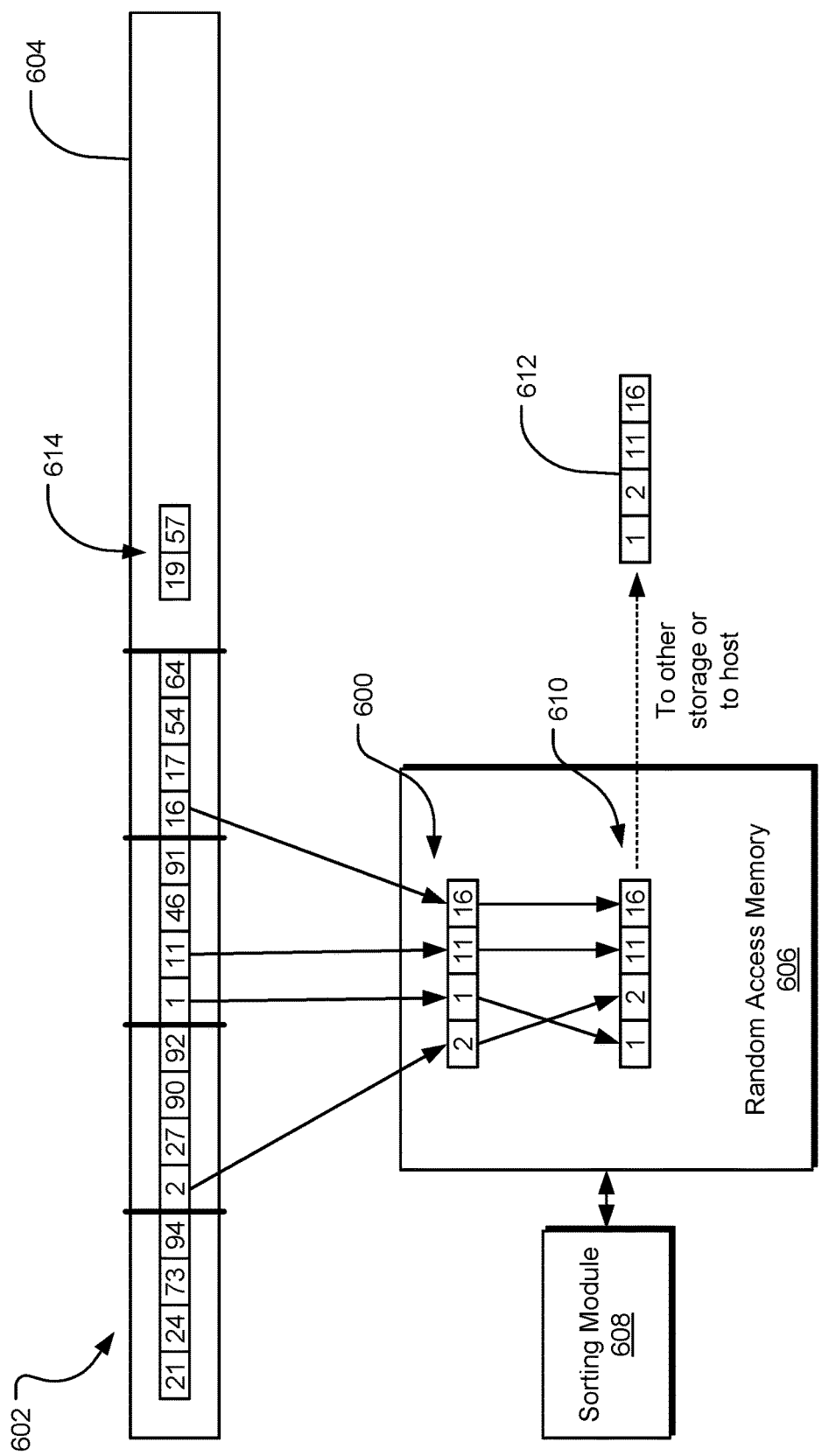
FIG. 6 illustrates an example sorting of a subset of data from a set of chunks for use external to a staging area.

FIG. 6 illustrates an example sorting of a subset of data 600 from a set of chunks 602 for use external to a staging area 604. A storage controller reads multiple sorted sets of data blocks (e.g., multiple chunks via multiple read accesses) from the staging area 604 into random access memory 606 (e.g., the entire memory 606 or a portion thereof). Note: Multiple extents of data may be read per media access to amortize the latencies between media accesses across multiple extents.

A sorting module 608 sorts the read data blocks received in the random access memory 606 according to a predefined order (e.g., in LBA order in FIG. 6). Various sorting methods, such as an N-ary merge sort that reads from the head of each sorted chunk, may be used to sort the data blocks received in the random access memory 606. The newly sorted chunk at 610 is written to other storage (e.g., to other intermediate storage, such as another staging area or a granule storage area, or to destination storage area) or to a host device. Responsive to the writing of the new chunk 612 to other storage, the storage controller updates the dynamic mapping information to reflect the new relationships between the LBAs (1, 2, 11, and 16) and their new PBAs within the other storage. The data blocks at 614 represent unsorted, un-chunked data blocks that are still recorded in the staging area 604.

In addition, in one embodiment, a stale data marking module marks the previous PBAs that stored the previous data blocks for the same LBAs as stale. In this manner, those PBAs may be reclaimed to be reused for new write data. In an alternative embodiment, however, data blocks in the staging area 604 corresponding to data blocks written to other storage need not be marked as stale. In such an implementation, multiple copies of the data blocks may be recorded in multiple physical locations within the data storage system (e.g., within a staging area, within a flash memory cache, within random access memory, within a granule storage area, within a destination storage area) and the storage controller can determine the physical location presenting the lowest latency for accessing a host-requested set of data blocks, whether for read or write operations. The dynamic mapping of the data blocks can manage the multiple physical locations for the same data blocks in combination with the expected latency associated with access at each physical location to reduce the average access latency for a given read or write command for the data blocks.

In one embodiment, data is read from the staging area 604 by the application of disc scheduling logic. For example, read requests are queued up and scheduled for execution based on seek times, latency times, etc. In some embodiments, disc scheduling logic may also be used for write operations, such as a write to a granule storage area or a destination storage area.

Figure 7:
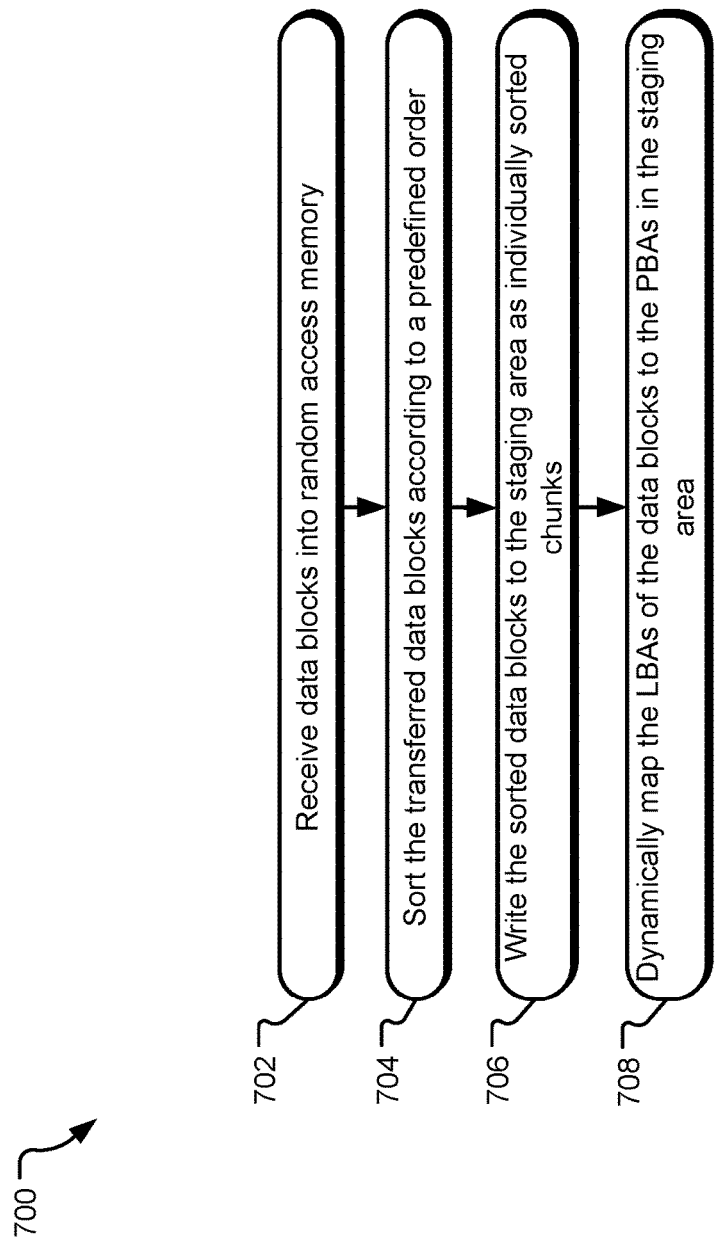
FIG. 7 illustrates example operations for chunking data blocks into a staging area.

FIG. 7 illustrates example operations 700 for chunking data blocks into a staging area. A receiving operation 702 receives logical-block-addressed data blocks from a host device or other storage into random access memory. A sorting operation 704 sorts the received data blocks into a predefined order. Example ordering may include without limitation LBA-order, most-frequently-accessed order, most-recently-accessed order, etc.

A writing operation 706 writes the sorted data blocks to the staging area as a set of sorted data blocks (e.g., referred to as sorted chunks). A dynamic mapping operation 708 dynamically maps the LBAs of the data blocks to the corresponding PBAs in the staging area of the data storage.

Figure 8:
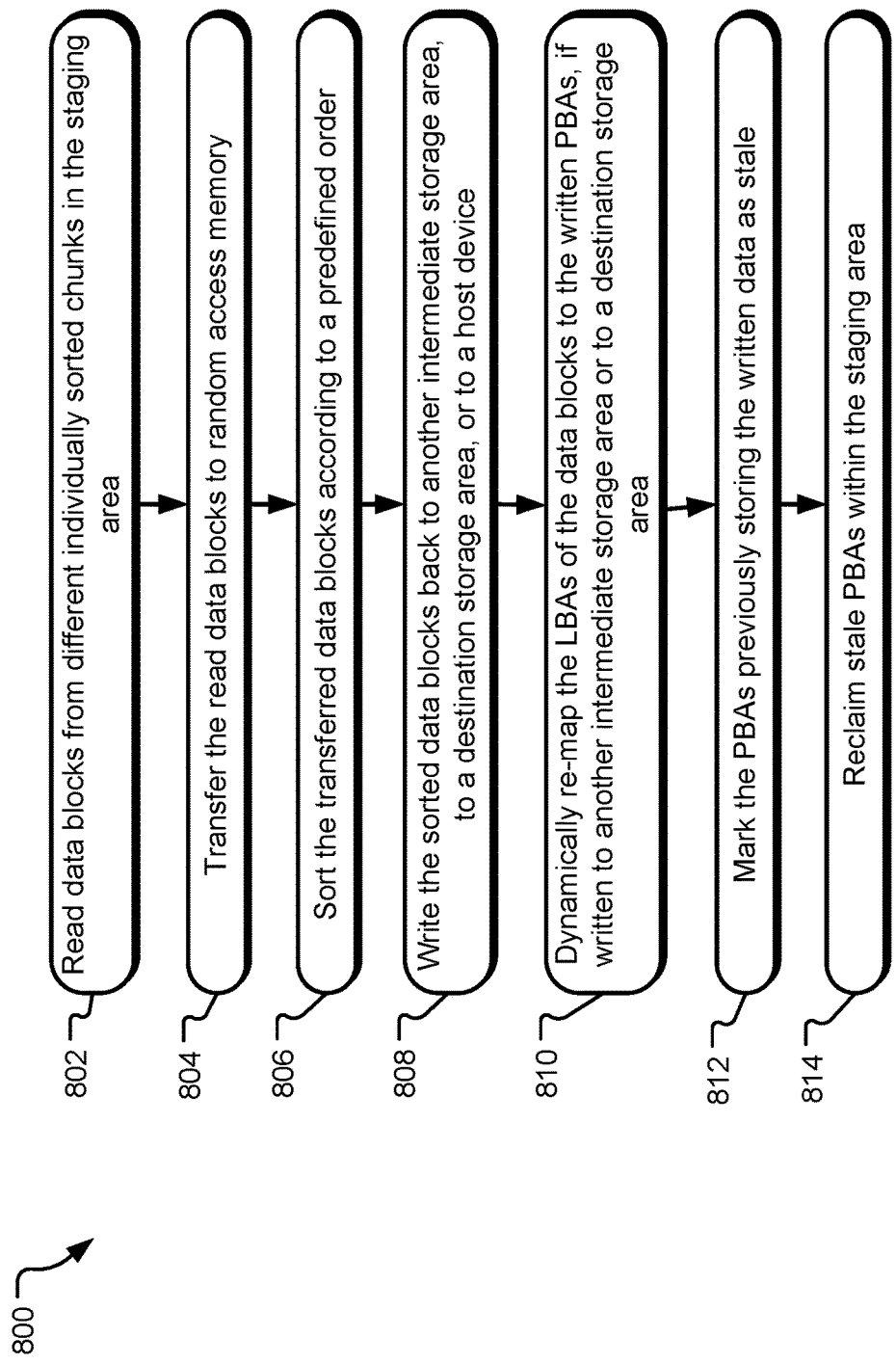
FIG. 8 illustrates example operations for re-sorting data blocks from a staging area to other intermediate storage.

FIG. 8 illustrates example operations 800 for re-sorting data blocks from a staging area to other intermediate storage. A reading operation 802 reads a relatively contiguous set of data blocks from different sets of sorted data blocks (e.g., chunks) in the staging area of the data storage. A transfer operation 804 transfers the read data blocks into a random access memory. A sorting operation 806 sorts the transferred data blocks into a predefined order. Example ordering may include without limitation LBA-order, most-frequently-accessed order, most-recently-accessed order, etc.

A writing operation 808 writes the sorted data blocks to another intermediate storage area, to a destination storage area, or to a host device. For example, the sorted data blocks may be written to a different staging area in chunks or to a granule storage area. In another example, the sorted data blocks may be written to a destination storage area of data storage for longer term storage. In yet another example, the sorted data blocks may be transferred to the host device in response to a read command. If the data blocks are re-written to the data storage, a dynamic re-mapping operation 810 dynamically re-maps the LBAs of the data blocks to the new corresponding physical block addresses in the staging area of the data storage. A marking operation 812 marks the PBAs from which the data blocks were read in the reading operation 802 as stale. A reclamation operation 814 reclaims stale PBAs in the staging area, for example, by re-using the stale PBAs in the staging area to recording other data blocks. For example, if the data blocks are moved to a destination storage area, the PBAs in the staging area previously storing those data blocks may be marked as stale and reclaimed for use with new data blocks. However, in an overprovisioning circumstance, the storage controller may maintain copies of the same data blocks in the storage area, in other intermediate storage areas, and/or in a destination storage area. In this manner, the storage controller can read requested data blocks from storage providing the lowest average access latency. Dynamic mapping maintains the mappings for each LBA-to-PBA relationship and may provide information assisting in the determination of the lowest average access latency for each relationship for a certain read command.

Figure 9:
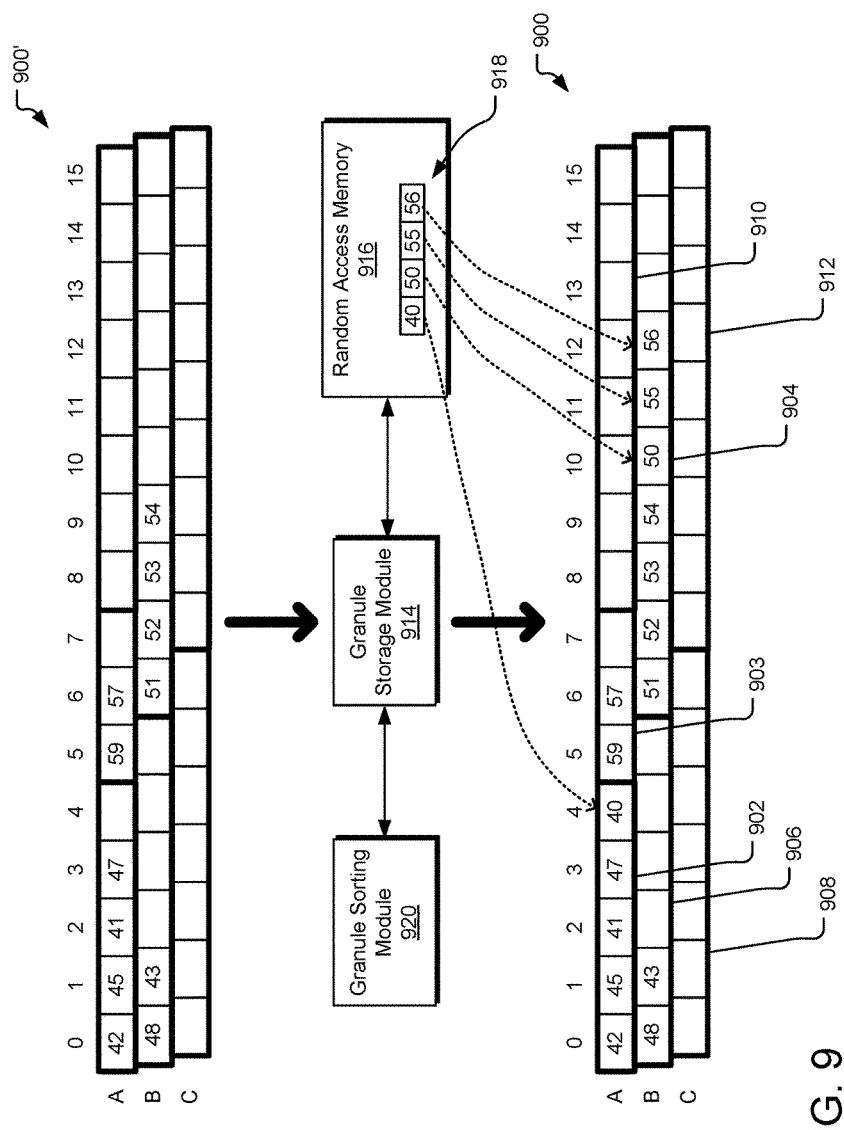
FIG. 9 illustrates an example granule storage area into which sorted data blocks are recorded in individual granules.

FIG. 9 illustrates an example granule storage area 900 into which sorted data blocks are recorded in individual granules 902, 903, and 904. (The granule storage area 900' represents a state of the granule storage area 900 prior to the writing of the new data blocks into the granule storage area 900. The A-B-C and 0 through 15 represent coordinates of individual data blocks within the granule storage area 900/900'.) The example granule storage area 900 also includes other granules that are not shown as including or not including mapped data, including granules 903, 906, 908, 910, and 912. Each granule is designated by a bold outline and contains data blocks dynamically constrained to a certain subset of LBAs (e.g., a specific LBA range, a most-recently-accessed LBA range, a most-frequently-accessed LBA range). The constraint can be dynamically defined and re-defined over time for each granule by the data storage system in order to store write data being written into the granule storage area. In addition, a granule or a any portion of a granule can be separately written if it does not immediately destabilize, erase or overwrite any other unintended data in the granule, in another granule, or any other recorded data area. The LBA-to-PBA relationships of the data blocks in the granules are dynamically mapped to allow reorganization of the data blocks in the granule storage area 900.

In one embodiment, each granule is of a fixed size, but different granules can have different sizes. In this way, individual smaller granules of data blocks can be sorted and re-written into larger granules within a granule storage area. Sets of granules may also be "appended" or aggregated so that the set of granules can contain data blocks satisfying the same LBA subset. For example, multiple granules may each be configured to store data blocks from the same LBA range. At some future point, the data blocks in these multiple granules can be sorted and/or compacted into other granules (typically one or more larger granules to provide increased data organization). The granule storage area 900 is shown as a non-shingled magnetic recording region, although granule storage may be stored in shingled magnetic recording region (see, e.g., FIGS. 11 and 12.).

A granule storage module 914 can receive write data blocks from a variety of sources, including directly from a host device, from a staging area (not shown), from random access memory 916, etc. Such data blocks may also be read from a different set of granules from granule storage area 900' and then written into a new set of granules in the granule storage area 900.

In one example, a set of data blocks 918 are received into the random access memory 916, sorted by a granule sorting module 920, and transferred to one or more individual granules in the granule storage area 900. It should be understood that the data blocks 918 may be sorted within the random access memory 916 or sorted when transferred to or from the random access memory (e.g., using scatter-gather DMA techniques).

As shown in the granule 902, the data blocks do not need to be completely sorted within an individual granule, but they are written in sorted manner in a given media access (e.g., a write operation). Other data blocks can be sorted and written in empty PBAs within a granule, as shown with regard to LBA 40 in the granule 902 (i.e., in PBA A4) and LBAs 50, 55, and 56 in granule 904 (i.e., B10, B11, and B12).

Figure 10:
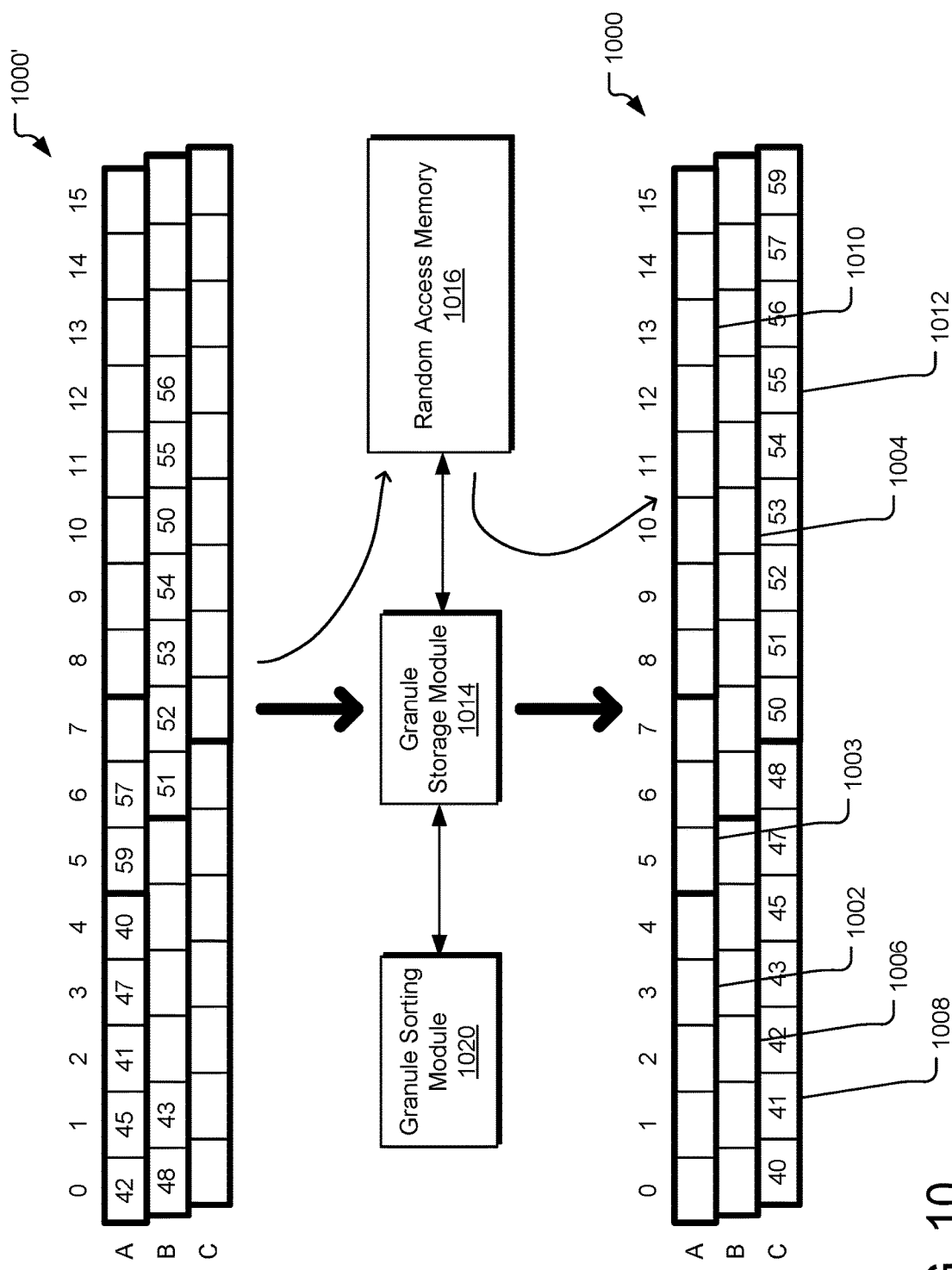
FIG. 10 illustrates an example granule storage area into which sorted data blocks are compacted into individual granules.

FIG. 10 illustrates an example granule storage area 1000 into which sorted data blocks are compacted into individual granules 1008 and 1012. (The granule storage area 1000' represents a state of the granule storage area 1000 prior to the writing of the new data blocks into the granule storage area 1000. The A-B-C and 0 through 15 represent coordinates of individual data blocks within the granule storage area 1000.) The example granule storage area 1000 also includes other granules that are not shown as including or not including mapped data, including granule 1002, 1003, 1004, 1006, and 1010. Each granule is designated by a bold outline and contains data blocks constrained to a certain subset of LBA (e.g., a specific LBA range, a most-recently-accessed LBA range, a most-frequently-accessed LBA range). In addition, a granule or any portion of a granule can be separately written if it does not immediately destabilize, erase or overwrite any other unintended data in the granule, in another granule, or in any other recorded data area. The LBA-to-PBA relationships of the data blocks in the granules are dynamically mapped to allow reorganization of the data blocks in the granule storage area 1000.

A granule storage module 1014 reads data blocks from granules of the granule storage area 1000' into random access memory 1016, sorts them via a granule sorting module 1020, and writes them to new granules or sets of granules (granules 1008 and 1012 in this case) in the granule storage area 1000/1000'. As a result, the granules 1008 and 1012 contain highly LBA-ordered data blocks in sequential PBAs of each granule. Further, the storage space of granules 1002, 1003, 1010, 1006, and 1004 is freed up for use by new write data to the granule storage area 1000. In this manner, the data blocks in the granule storage area 1000 are considered compacted and highly organized (e.g., dynamically mapped in an LBA-to-PBA ordering). It should be understood that the data may also be compacted in place, being re-written back to the same granule, rather than being compacted/written into a different granule, subset of granules, or set of granules.

Figure 11:
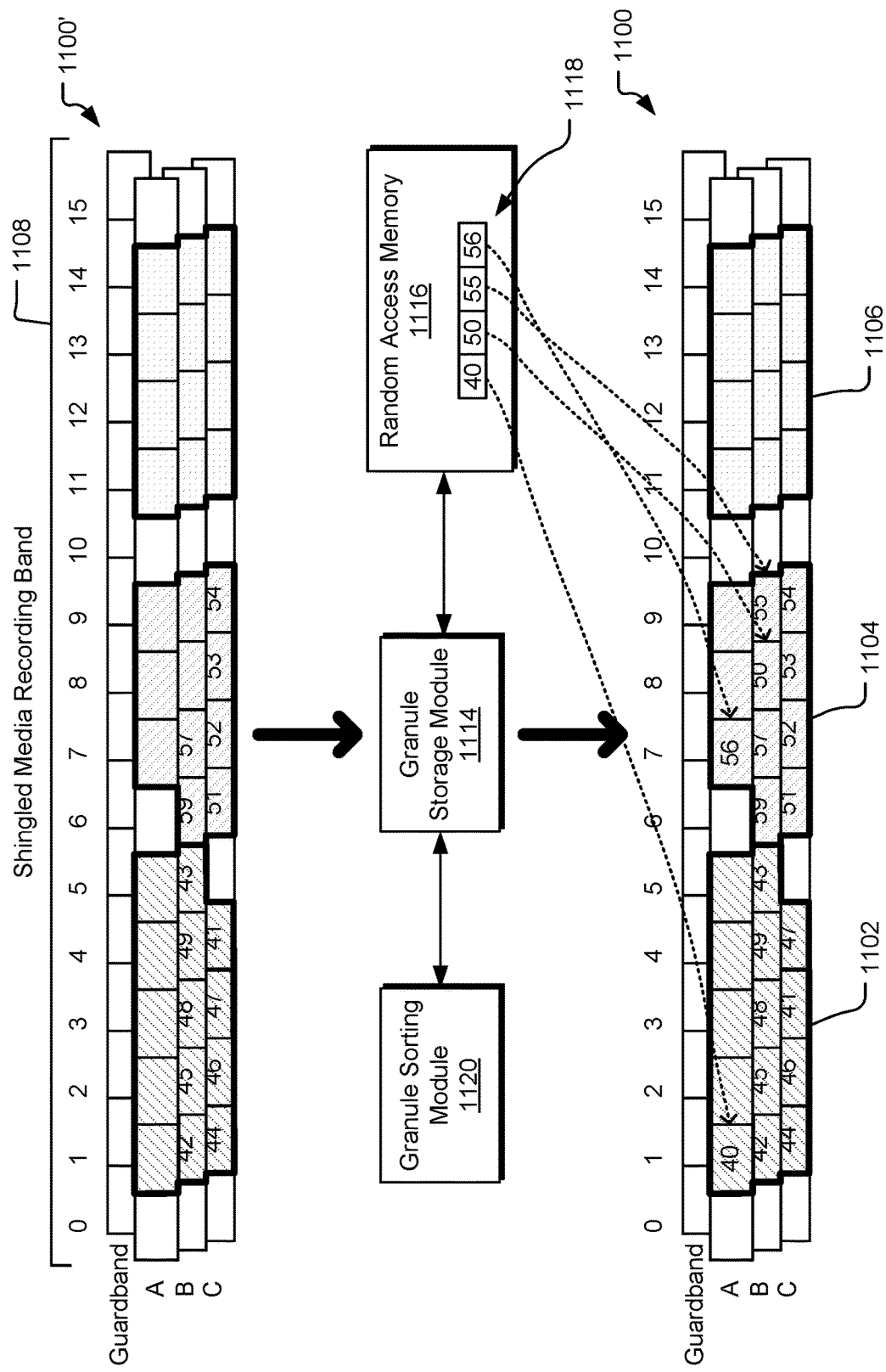
FIG. 11 illustrates an example granule storage area in a band of shingled magnetic recording into which sorted data blocks are recorded into individual granules.

FIG. 11 illustrates an example granule storage area 1100 in a band 1108 of shingled magnetic recording into which sorted data blocks are recorded into individual granules 1102 and 1104. (The granule storage area 1100' represents a state of the granule storage area 1100 prior to the writing of the new data blocks into the granule storage area 1100. The A-B-C and 0 through 15 represent coordinates of individual data blocks within the granule storage area 1100/1100'.) The example granule storage area 1100 also includes another granule 1106 within the same shingled magnetic recording band that is shown as not including mapped data. Each granule is designated by a bold outline and contains data blocks constrained to a certain subset of LBAs (e.g., a specific LBA range, a most-recently-accessed LBA range, a most-frequently-accessed LBA range). The constraint can be dynamically defined and re-defined over time for each granule by the data storage system in order to store write data being written into the granule storage area. In addition, a granule or any portion of a granule can be separately written if it does not immediately destabilize, erase or overwrite any other unintended data in the granule, in another granule, or in any other recorded data area. The LBA-to-PBA relationships of the data blocks in the granules are dynamically mapped to allow reorganization of the data blocks in the granule storage area 1100.

In one embodiment, each granule is of a fixed size, but different granules can have different sizes. In this way, individual smaller granules of data blocks can be sorted and re-written into larger granules within a granule storage area. Furthermore, as shown in FIG. 11, a single band 1108 can include more than one granule. Sets of granules may also be "appended" or aggregated so that the set of granules can contain data blocks satisfying the same LBA subset constraint. For example, multiple granules may each be configured to store data blocks from the same LBA range. At some future point, the data blocks in these multiple granules can be sorted and/or compacted into other granules (typically one or more larger granules to provide increased data organization).

A granule storage module 1114 can receive write data blocks from a variety of sources, including directly from a host device, from a staging area (not shown), from random access memory 1116, etc. Such data blocks may also be read from a different set of granules from granule storage area 1100' and then written into a new set of granules in the granule storage area 1100.

In one example, a set of data blocks 1118 are received into the random access memory 1116, sorted by a granule sorting module 1120, and transferred to one or more individual granules in the granule storage area 1100. It should be understood that the data blocks 1118 may be sorted within the random access memory 1116 or sorted when transferred to or from the random access memory (e.g., using scatter-gather DMA techniques).

As shown in the granule 1102, the data blocks do not need to be completely sorted within an individual granule, but they are written in sorted manner in a given media access (e.g., a write operation). Other data blocks can be sorted and written in empty PBAs within a granule, as show with regard to LBA 40 in the granule 1102 (i.e., in PBA A1) and LBAs 50, 55, and 56 in granule 1104 (i.e., in PBAs B8, B9, and A7).

Figure 12:
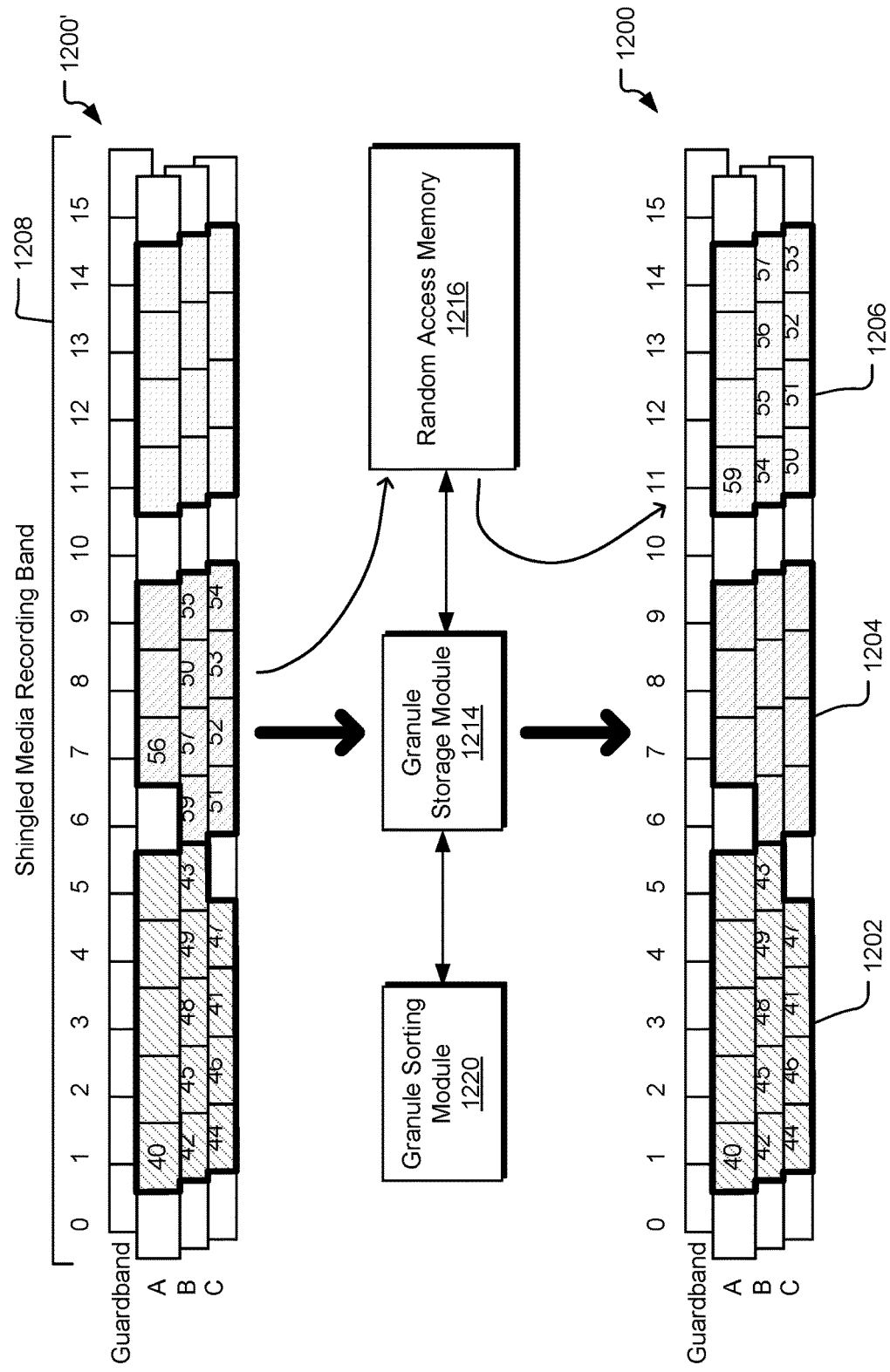
FIG. 12 illustrates an example granule storage area in a band of shingled magnetic recording into which sorted data blocks are sorted into an individual granule.

FIG. 12 illustrates an example granule storage area 1200 in a band 1208 of shingled magnetic recording into which sorted data blocks are sorted into an individual granule 1206. (The granule storage area 1200' represents a state of the granule storage area 1200 prior to the writing of the new data blocks into the granule storage area 1200. The A-B-C and 0 through 15 represent coordinates of individual data blocks within the granule storage area 1200/1200'.) The example granule storage area 1200 also includes other granules that are not shown as including or not including mapped data, including granule 1202 and 1206. Each granule is designated by a bold outline and contains data blocks constrained to a certain subset of LBA (e.g., a specific LBA range, a most-recently-accessed LBA range, a most-frequently-accessed LBA range). In addition, a granule or any portion of a granule can be separately written if it does not immediately destabilize, erase or overwrite any other unintended data in the granule, in another granule, or in any other recorded data area. The LBA-to-PBA relationships of the data blocks in the granules are dynamically mapped to allow reorganization of the data blocks in the granule storage area 1200.

A granule storage module 1214 reads data blocks from a granule of the granule storage area 1200' into random access memory 1216, sorts them via a granule sorting module 1220, and writes them to new granules or sets of granules (granules 1206 in this case) in the granule storage area 1200. As a result, the granule 1206 contains highly LBA-ordered data blocks in sequential PBAs of each granule or near sequential PBAs of each granule (e.g., such as in the presence of defective PBAs in the granule). Further, the storage space of granules 1204 is freed up for use by new write data to the granule storage area 1200. In this manner, the data blocks in the granule storage area 1200 are considered compacted and highly organized (e.g., dynamically mapped in an LBA-to-PBA ordering).

In a subsequent operation, the granule storage module 1214 may write other data blocks satisfying an appropriate LBA-related constraint into granules 1202 and 1204. For example, via dynamic mapping, the constraint for the granule 1204, which was previously to store data blocks of LBAs 50-59, can be changed to store LBAs from 40-49. Accordingly, the granule storage module 1214 can write a new set of data blocks in the LBA 40-49 range into the granule 1204. By appending the granule 1204 to the same LBA-based constraint as granule 1202, the set of granules 1202 and 1204 can support the same LBA grouping of data blocks. That is, the non-stale data blocks in the LBA 40-49 can span both granules 1202 and 1204.

A similar operation can also provide data block compaction within the granule storage area 1200, such as described with regard to FIG. 10. In addition, the dynamic mapping can allow a compression algorithm to be applied to the data in the granule storage area 1200, yielding the option of requiring fewer PBAs than LBAs to store data within a granule.

Furthermore, as with the staging area, partial code words and/or incremental codewords may be employed as data blocks are written to partially filled granules. In this manner as data blocks are written to data storage, an additional piece of error correction code (ECC) is also written into the granule storage area 1200. The combination of the new data blocks and the new error code is referred to as a "codeword." When writing to the granule storage area 1200, variable amounts of data (e.g., a variable number of data blocks). To maintain the addition ECC, the codeword size can vary or the additional ECC is computed in an incremental fashion and written at fixed boundaries (e.g., at locations appropriate for fixed, rather than variable, word sizes).

Figure 13:
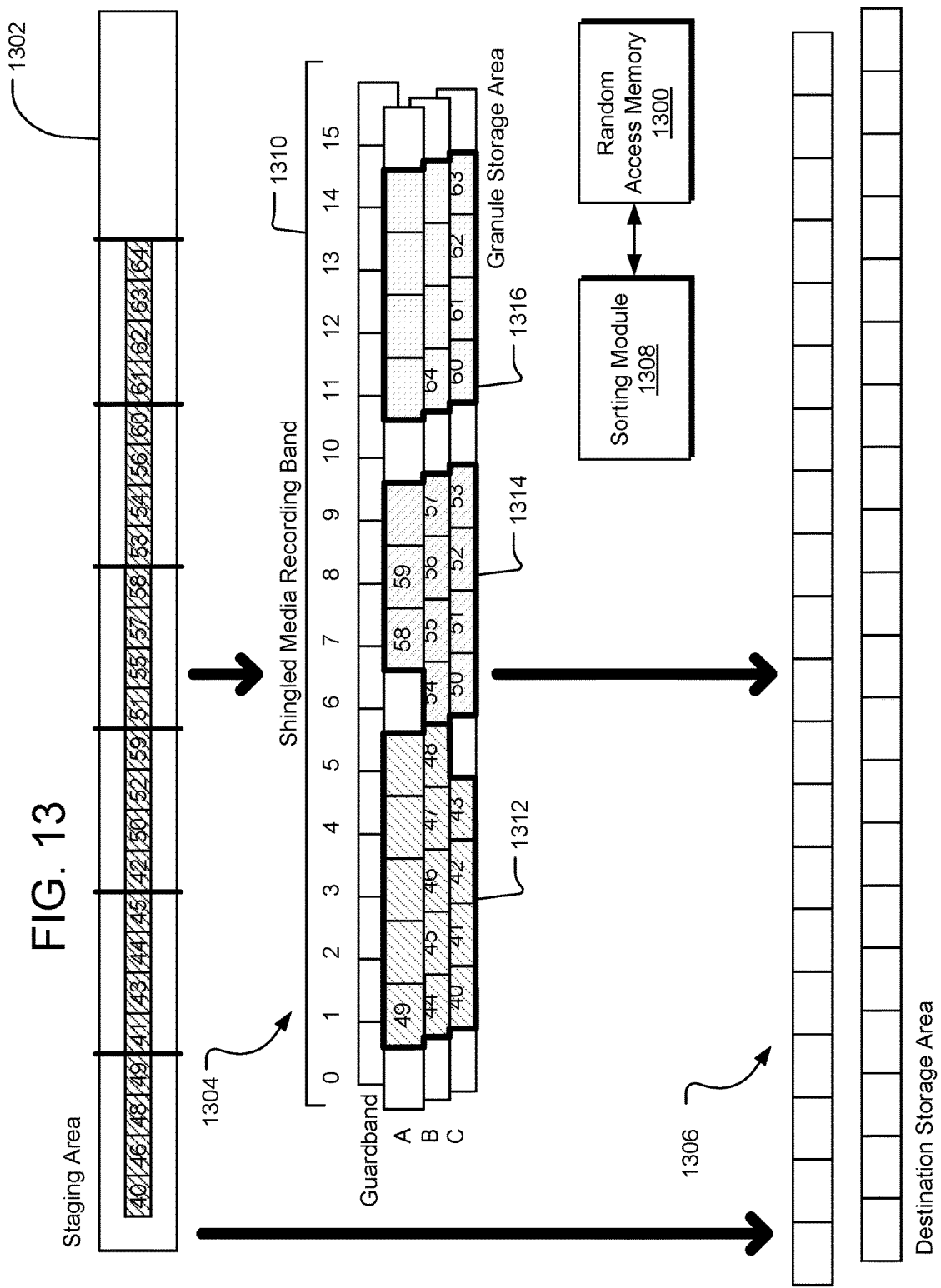
FIG. 13 illustrates example levels of storage including a random access memory, a staging area, a granule storage area, and a destination storage area.

FIG. 13 illustrates example levels of storage including a random access memory 1300, a staging area 1302, a granule storage area 1304, and a destination storage area 1306 in a data storage system. Data blocks are recorded in individually-sorted sets ("chunks") in the staging area 1302. These data blocks have been written to the staging area 1302 from the random access memory 1300. In one embodiment, the previous unsorted data blocks are sorted according to a given sort order (e.g., LBA order in the case shown in FIG. 13). In other implementations, the data blocks were sorted during a transfer to or from the random access memory 1300 (e.g., via a scatter-gather DMA process).

As the staging area fills up with sets of individually-sorted data, the data storage system performs processes to make space available for new write data. In some cases, data blocks in the staging area 1302 can become stale as new data corresponding to the same LBA is written into the staging area 1302. Accordingly, the data storage system can perform garbage collection or compaction to reclaim the storage space from PBAs storing stale data. In other cases, data blocks in the staging area 1302 can be read into random access memory 1300 and sorted by the storing module 1308 for storage into the granule storage area 1304.

The granule storage area 1304 shown in FIG. 13 is in the form of a band 1310 of shingled magnetic recording containing three granules 1312, 1314, and 1316. The A-B-C and 0 through 15 represent coordinates of individual data blocks within the granule storage area 1300. In one implementation, the data blocks in the staging area 1302 are read into the random access memory 1300, sorted by a sorting module 1308, and written into granules according to the dynamically mapped constraints of each granule. For example, in FIG. 13, granule 1312 is allocated to LBAs 40-49, granule 1314 is allocated to LBAs 50-59, and granule 1316 is allocated to LBAs 60-69.

It should be understood that the dynamically mapped constraints shown in FIG. 13 are mere examples. In addition, individual granules can be dynamically mapped with the same constraints to append the two granules (effectively growing the granule) within the same constraint. For example, the LBA constraints of granules 1312 and 1314 may be dynamically mapped to form a set of granules that include LBAs 30-61. Accordingly, LBA 60 could be written to PBA A9 and LBA 61 could be written to PBA A2. As such, not only can the LBA content of a granule change, multiple granules can be aggregated to form a sorted set of granules, which assists with compaction and overprovisioning. In some embodiments, data blocks may be written from the staging area 1302 through the random access memory to 1300 to the destination storage area 1306 without first being stored in the granule storage area 1304.

In FIG. 13, the data blocks in the staging area 1302 are marked as stale after they are written into the granule storage area 1304 (e.g., the dynamic mapping of the data storage system no longer maps logical-block-addressed data blocks to the PBAs in the staging area 1302), and the PBAs in the staging area 1302 can therefore be used for new write data. In addition, the destination storage area 1306 does not currently have any data blocks written to it. Also note that the random access memory 1300 may retain one or more data blocks for access by the host device, even if the same data blocks have been written to the staging area 1302, the granule storage area 1304, or the destination storage area 1306. This ability to maintain extra copies of data blocks allowed by the ability to dynamically map LBAs to PBAs and allows the data storage system to determine the lowest latency access option available to it for any read data requested by the host device. (For example, dynamic mapping allows a data storage system to decide whether to read requested data from a storage medium or from random access memory.)

Figure 14:
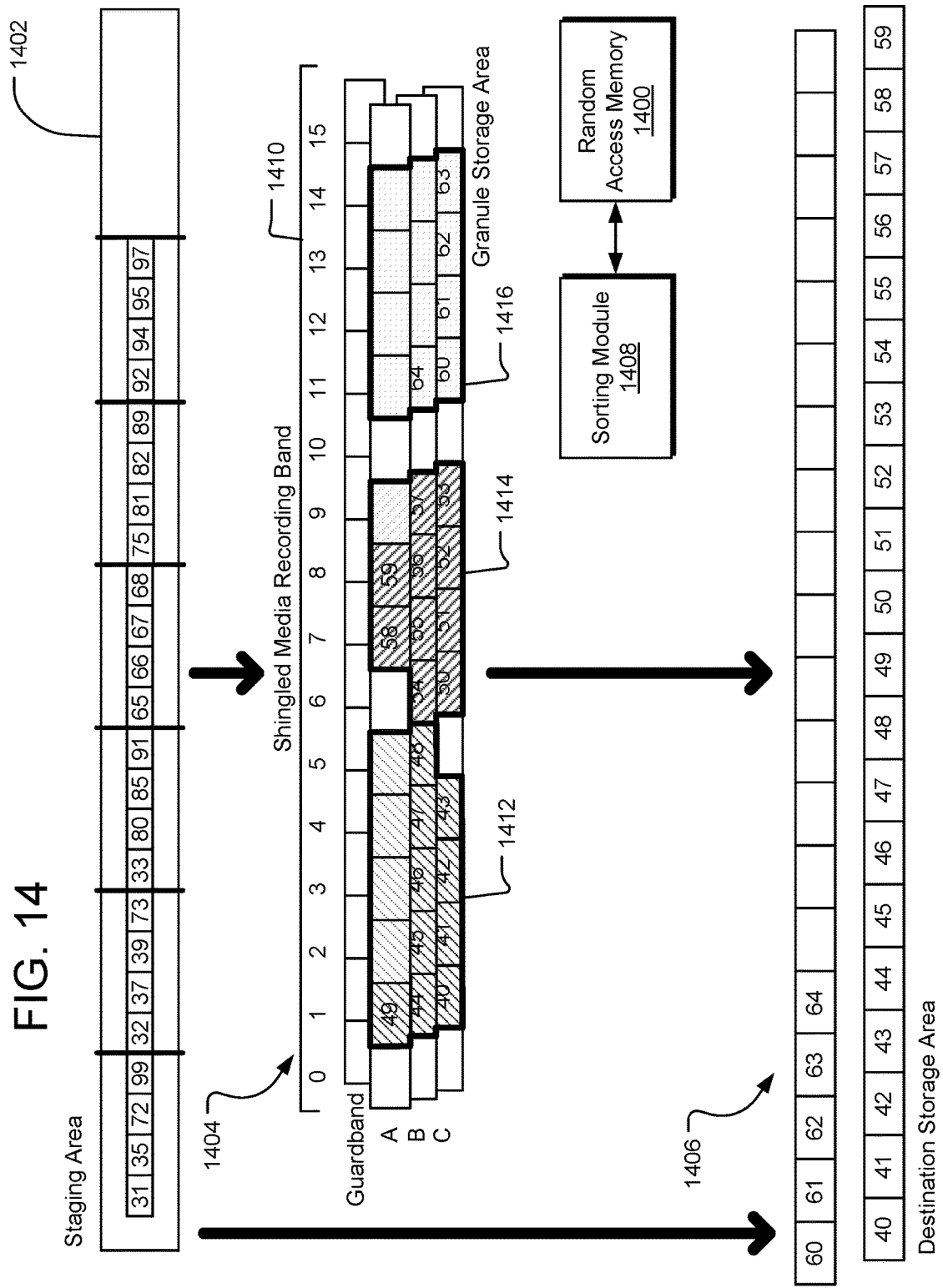
FIG. 14 illustrates other example levels of storage including a random access memory, a staging area, a granule storage area, and a destination storage area.

FIG. 14 illustrates other example levels of storage including a random access memory 1400, a staging area 1402, a granule storage area 1404, and a destination storage area 1406. The staging area 1402 includes new individually-sorted chunks. The granule storage area 1404 includes granules 1412 and 1414 with stale data blocks, which can be reclaimed and reused for new write data, and a granule 1416, which includes data that, while written to the destination storage area 1406, is not stale. Accordingly, the granule 1416 contains an additional copy of live data, which may be read by the storage controller. Such data copies may be maintained for a period of time (e.g., until the granules are compacted).

The destination storage area 1406 may be in non-shingled format (as shown) or shingled format. The sorted data blocks from the granule storage area 1404 have been written through the random access memory to the destination storage area 1406 in a highly ordered configuration to provide a relatively low average latency of access.

Figure 15:
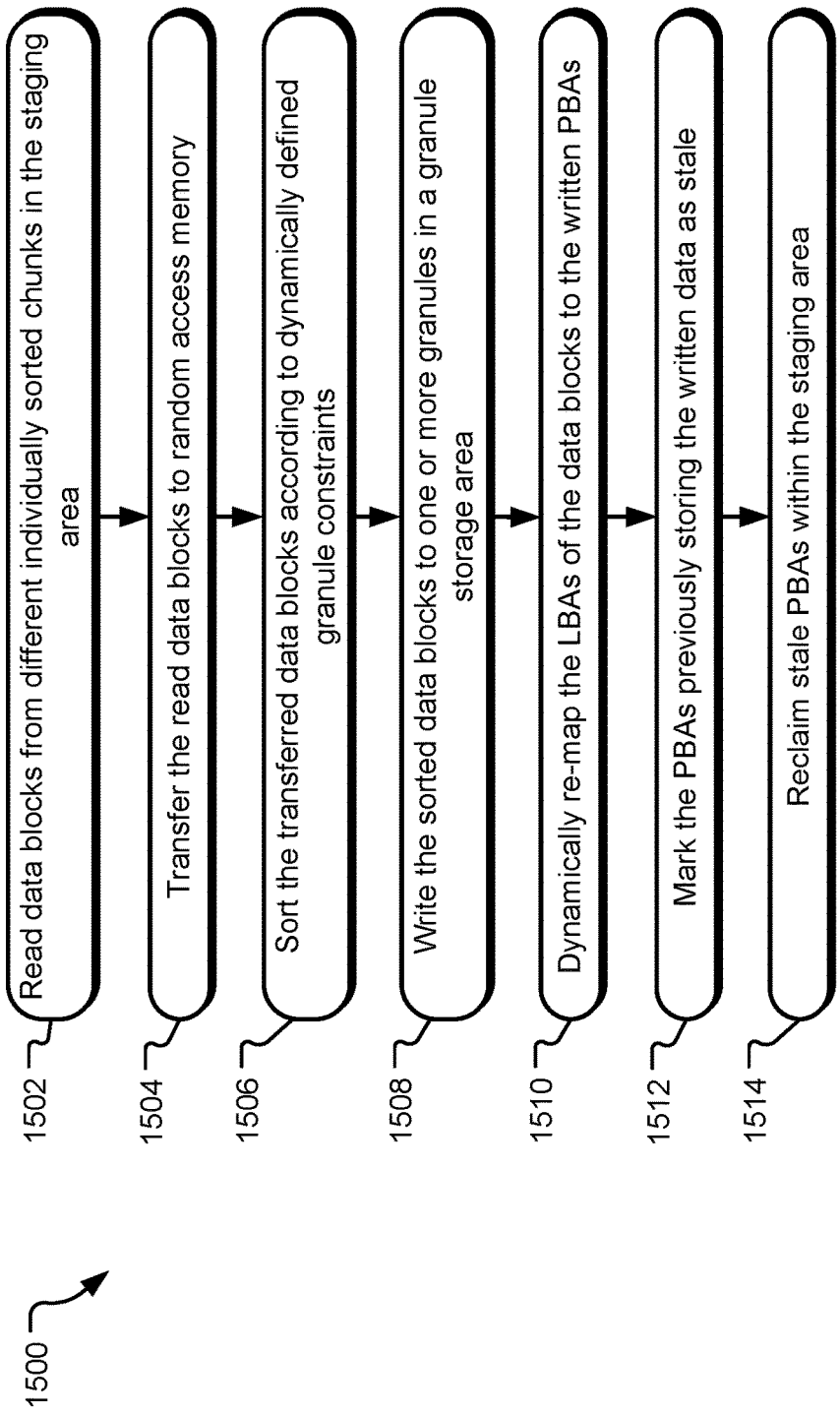
FIG. 15 illustrates example operations for storing data blocks into a granule storage area.

FIG. 15 illustrates example operations 1500 for storing data blocks into a granule storage area. The operations 1500 of FIG. 15 depict a write operation from a staging area through a random access memory to a granule storage area. Nevertheless, it should be understood that data blocks can also be written from the host device to granule storage through a random access memory, without intermediate storage in a staging area.

A reading operation 1502 reads data blocks from individual sorted chunks in the staging area. A transferring operation 1504 transfers the read data blocks to the random access memory. A sorting operation 1506 sorts the transferred data according to dynamically defined granule constraints. A writing operation 1508 writes the sorted data blocks to one or more granules in the granule storage area 1508, in accordance with the defined granule constraints.

A mapping operation 1510 dynamically re-maps the LBAs of the data blocks to the written PBAs of the one or more granules in the granule storage area 1508. A marking operation 1512 marks the PBAs previously storing the written data in the staging area as stale. Note: The mapping operation 1510 and the marking operation 1512 may be integrated into the same operation—re-mapping the LBAs inherently marks the previous PBAs as stale. A reclamation operation 1514 reclaims the stale PBAs within the staging area for use with new write data.

Figure 16:
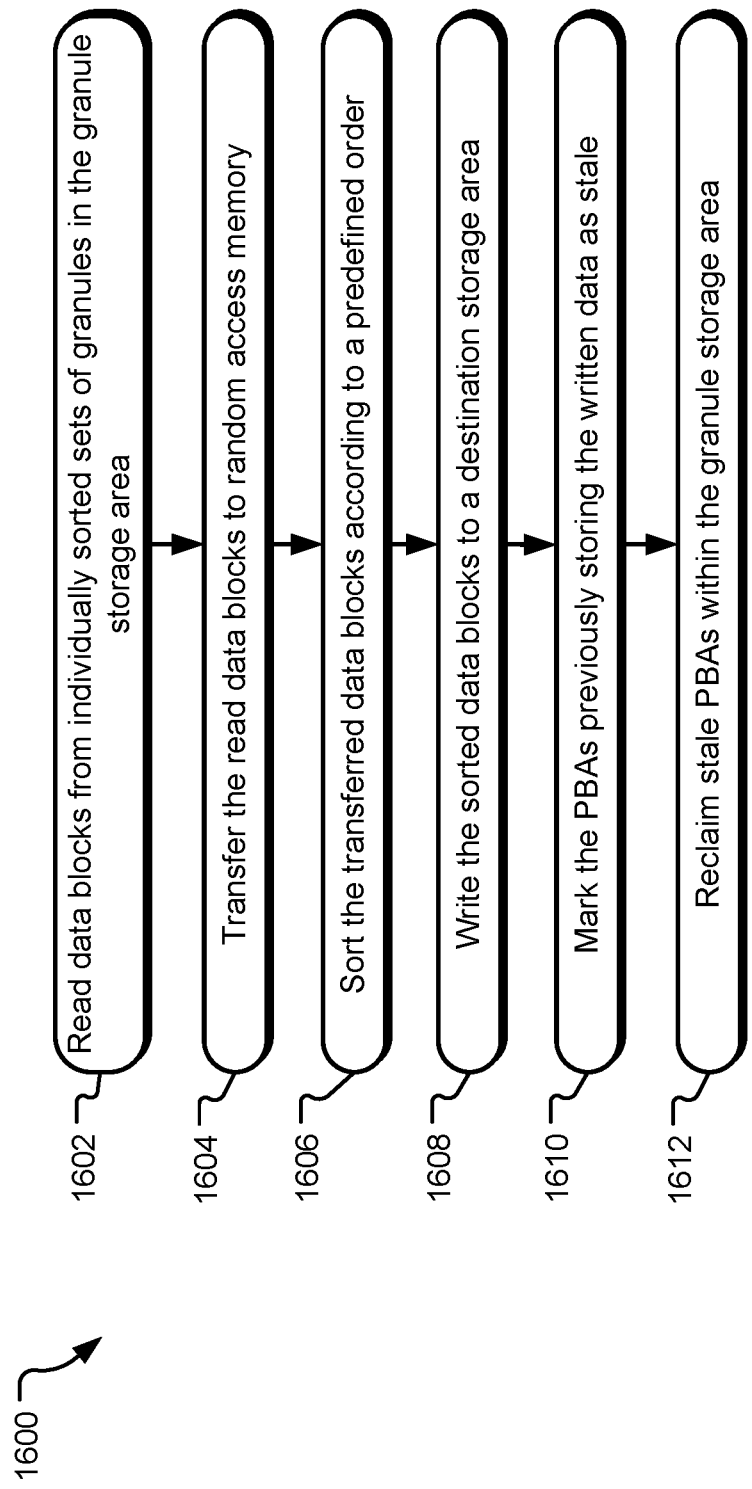
FIG. 16 illustrates example operations for storing data blocks into a destination storage area.

FIG. 16 illustrates example operations 1600 for storing data blocks into a destination storage area. A reading operation 1602 reads data blocks from individual sorted granule sets in a granule storage area. A transferring operation 1604 transfers the read data blocks to the random access memory. A sorting operation 1606 sorts the transferred data according to a defined ordering. A writing operation 1608 writes the sorted data blocks according to relatively static LBA-to-PBA mappings into the destination storage area. It should be noted that LBA-to-PBA mappings for large discrete regions (e.g., 256 MB) may still change over time (e.g., during defragmentation, when damaged PBAs are detected, etc.).

The data blocks written to the destination storage area may be retained in the random access memory or the granule storage area as additional live copies of the data. Alternatively, the corresponding granules and/or the random access memory may be reused for new write data.

The embodiments of the technology described herein are implemented as logical steps in one or more computer systems. The logical operations of the present technology are implemented (1) as a sequence of processor-implemented steps executing in one or more computer systems and (2) as interconnected machine or circuit modules within one or more computer systems. The embodiment is a matter of choice, dependent on the performance requirements of the computer system implementing the technology. Accordingly, the logical operations making up the embodiments of the technology described herein are referred to variously as operations, steps, objects, or modules. Furthermore, it should be understood that logical operations may be performed in any order, unless explicitly claimed otherwise or a specific order is inherently necessitated by the claim language.

The data storage and/or memory may be embodied by various types of storage, such as hard disc media, a storage array containing multiple storage devices, optical media, solid-state drive technology, ROM, RAM, and other technology. The operations may be implemented in firmware, software, hard-wired circuitry, gate array technology and other technologies, whether executed or assisted by a microprocessor, a microprocessor core, a microcontroller, special purpose circuitry, or other processing technologies. It should be understood that a write controller, a storage controller, data write circuitry, data read and recovery circuitry, a stale data marking module, a sorting module, and other functional modules of a data storage system may include or work in concert with a processor for processing processor-readable instructions for performing a system-implemented process.

The above specification, examples, and data provide a complete description of the structure and use of exemplary embodiments of the technology. Since many embodiments of the technology can be made without departing from the spirit and scope of the technology, the invention resides in the claims hereinafter appended. Furthermore, structural features of the different embodiments may be combined in yet another embodiment without departing from the recited claims.

What is claimed is:

1. A method comprising:
    writing a first data block to a first granule of multiple individual granules in a granule storage area of data storage, the first granule constrained for a series of write operations to receive data of a first range of logical block addresses (LBAs) including an LBA of the first data block;
    writing a second data block to a second granule of the multiple individual granules, the second granule constrained for the series of write operations to receive data of a second range of LBAs including an LBA of the second data block, wherein the multiple individual granules are recorded in a single shingled magnetic recording band and wherein at least two of the multiple individual granules are simultaneously constrained to store data of overlapping subsets of logical block addresses;
    sorting together data blocks of the first granule and the second granule to form a compacted granule; and
    writing the compacted granule to a destination storage area.

2. The method of claim 1, wherein each of the multiple individual granules is dynamically constrained to hold data of a set range of logical block addresses.

3. The method of claim 1, wherein data blocks in the multiple individual granules are not arranged according to a logical block address order.

4. The method of claim 1 further comprising:
    sorting groups of data blocks including the first data block and the second data block according to subsets of logical block addresses prior to writing the data blocks to the multiple individual granules.

5. The method of claim 1 further comprising:
    receiving into random access memory data blocks from the multiple individual granules recorded in the granule storage area of the data storage; and
    re-sorting the data blocks from the multiple individual granules received in the random access memory.

6. The method of claim 1 further comprising:
    receiving into random access memory data blocks from the multiple individual granules recorded in the granule storage area of the data storage; and
    writing the data blocks of the multiple individual granules from the random access memory to a host device.

7. The method of claim 1, wherein the destination storage area is a statically mapped region.

8. A data storage system comprising:
    data storage;
    random access memory; and
    a storage controller communicatively coupled to the random access memory and the data storage and being configured to:
        write a first data block to a first granule of multiple individual granules in a granule storage area of data storage, the first granule constrained for a series of write operations to receive data of a first range of logical block addresses (LBAs) including an LBA of the first data block;
        write a second data block to a second granule of the multiple individual granules, the second granule constrained for the series of write operations to receive data of a second range of LBAs including an LBA of the second data block, wherein the multiple individual granules are recorded in a single shingled magnetic recording band and are each constrained to store data of a subset of logical block addresses and at least two of the multiple individual granules are simultaneously constrained to store data of overlapping subsets of logical block addresses;
        sort together data blocks of at least two of the multiple individual granules to form a compacted granule; and
        write the compacted granule to a destination storage area.

9. The data storage system of claim 8 wherein the destination storage area is a statically mapped region.

10. The data storage system of claim 8 wherein data blocks in the multiple individual granules are not arranged according to a perfect logical block address order.

11. The data storage system of claim 8 wherein the storage controller is further configured to read into random access memory data blocks from multiple individual granules recorded in the granule storage area and write the data blocks to a statically-mapped region of the destination storage area.

12. One or more processor-readable storage media storing processor-readable instructions for performing a system-implemented process in a data storage system, wherein the processor-readable storage media is not a carrier wave or propagating signal and the process further comprises:

writing a first data block to a first granule of multiple individual granules in a granule storage area of data storage, the first granule constrained for a series of write operations to receive data of a first range of logical block addresses (LBAs) including an LBA of the first data block;

writing a second data block to a second granule of the multiple individual granules, the second granule constrained for the series of write operations to receive data of a second range of LBAs including an LBA of the second data block, wherein the multiple individual granules are recorded in a single shingled magnetic recording band and are each constrained to store data of a subset of logical block addresses and at least two of the multiple individual granules are simultaneously constrained to store data of overlapping subsets of logical block addresses;

sorting together, in memory, data blocks of at least two of the multiple individual granules to form a compacted granule; and writing the compacted granule to a destination storage area.

13. The one or more processor-readable storage media of claim 12 wherein the process further comprises:

dynamically mapping logical block addresses of the written data blocks to new physical block addresses in the granule storage area of the data storage.

14. The one or more processor-readable storage media of claim 12 wherein the sorting operation comprises:

sorting the data blocks according to a subset of logical block addresses.

15. The one or more processor-readable storage media of claim 12 wherein the destination storage area is a statically mapped region.

16. The one or more processor-readable storage media of claim 12 wherein data blocks in the multiple individual granules are not arranged according to a perfect logical block address order.

17. The one or more processor-readable storage media of claim 12, wherein the process comprises:

sorting the data blocks according to subsets of logical block addresses prior to writing the data blocks to the multiple individual granules.

* * * * *